United States Patent
Fujii et al.

(10) Patent No.: US 10,691,005 B2
(45) Date of Patent: Jun. 23, 2020

(54) OPTICAL ELEMENT AND DISPLAY APPARATUS

(71) Applicant: SONY CORPORATION, Tokyo (JP)

(72) Inventors: Kentaro Fujii, Kanagawa (JP); Tomoki Ono, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/344,240

(22) PCT Filed: Oct. 13, 2017

(86) PCT No.: PCT/JP2017/037144
§ 371 (c)(1),
(2) Date: Apr. 23, 2019

(87) PCT Pub. No.: WO2018/105234
PCT Pub. Date: Jun. 14, 2018

(65) Prior Publication Data
US 2019/0285975 A1    Sep. 19, 2019

(30) Foreign Application Priority Data

Dec. 7, 2016  (JP) .................................. 2016-237591

(51) Int. Cl.
*G03B 21/20*        (2006.01)
*G02B 26/10*        (2006.01)
(Continued)

(52) U.S. Cl.
CPC ....... *G03B 21/2006* (2013.01); *G02B 26/101* (2013.01); *G03B 21/00* (2013.01);
(Continued)

(58) Field of Classification Search
CPC ...... G02B 26/101; G03B 21/00; G03B 21/14; G03B 21/2006; G03B 21/2053;
(Continued)

(56) References Cited

U.S. PATENT DOCUMENTS

| 2014/0078274 A1* | 3/2014 | Kroon ................... G02B 30/27 348/59 |
| 2015/0115219 A1 | 4/2015 | Oh et al. |

(Continued)

FOREIGN PATENT DOCUMENTS

| JP | 02-310975 A | 12/1990 |
| JP | 08-236853 A | 9/1996 |

(Continued)

OTHER PUBLICATIONS

International Search Report and Written Opinion of PCT Application No. PCT/JP2017/037144, dated Nov. 28, 2017, 7 pages of ISRWO.

*Primary Examiner* — Nelson M Rosario
(74) *Attorney, Agent, or Firm* — Chip Law Group

(57) ABSTRACT

[Object] To provide an optical element and a display apparatus capable of reducing a waveguide loss and achieving laser oscillation suppression and a high output. [Solving Means] An optical element according to the present technology includes a substrate, a first end which is a light emission end, and a second end provided on an opposite side to the first end, the optical element including a first electrode layer, a first semiconductor layer, a second semiconductor layer, an active layer, and a second electrode layer. The first electrode layer has a stripe form extended from the second end toward the first end. A waveguide structure included in the first conductivity type layer, the active layer, and second conductivity type layer includes a first waveguide and a second waveguide, and the second waveguide has a tapered structure that makes a beam spot of light incident from the first waveguide smaller. The optical element includes a reflection surface that is formed by an excavation structure provided from the first semiconductor layer to the active layer on at least one of the first end and the second end, and (Continued)

reflects light incident from the first waveguide or the second waveguide.

12 Claims, 19 Drawing Sheets

(51) Int. Cl.
    *G03B 21/28*     (2006.01)
    *H01L 33/00*     (2010.01)
    *H01L 33/10*     (2010.01)
    *H04N 9/31*     (2006.01)
    *G03B 21/14*     (2006.01)
    *H01L 33/20*     (2010.01)
    *G03B 21/00*     (2006.01)

(52) U.S. Cl.
    CPC ......... *G03B 21/14* (2013.01); *G03B 21/2053* (2013.01); *G03B 21/28* (2013.01); *H01L 33/0045* (2013.01); *H01L 33/10* (2013.01); *H01L 33/20* (2013.01); *H04N 9/3135* (2013.01)

(58) Field of Classification Search
    CPC ..... G03B 21/28; H01L 33/0045; H01L 33/10; H01L 33/24; H01L 33/46; H04N 9/3135
    See application file for complete search history.

(56) References Cited

U.S. PATENT DOCUMENTS

2016/0300979 A1    10/2016   Oh et al.
2017/0315372 A1*  11/2017   Bang .................... G02B 3/0037

FOREIGN PATENT DOCUMENTS

| | | |
|---|---|---|
| JP | 2011-155103 A | 8/2011 |
| JP | 2012-033797 A | 2/2012 |
| JP | 2012-142504 A | 7/2012 |
| JP | 2013-004855 A | 1/2013 |
| KR | 10-2015-0048017 A | 5/2015 |
| WO | 2012/017505 A1 | 2/2012 |

* cited by examiner

B

OPTICAL ELEMENT AND DISPLAY APPARATUS

CROSS REFERENCE TO RELATED APPLICATIONS

This application is a U.S. National Phase of International Patent Application No. PCT/JP2017/037144 filed on Oct. 13, 2017, which claims priority benefit of Japanese Patent Application No. JP 2016-237591 filed in the Japan Patent Office on Dec. 7, 2016. Each of the above-referenced applications is hereby incorporated herein by reference in its entirety.

TECHNICAL FIELD

The present technology relates to a technology of a semiconductor laser and a super luminescent diode (SLD).

BACKGROUND ART

A super luminescent diode (SLD) is a light emission element which has characteristics of having a wide light emission spectrum width relatively close to a light emission diode and emitting light at a narrow radiation angle with a strong intensity like a light emission state of a semiconductor laser. The light emission element as described above can be used as a light source of a projector, for example, and is demanded to have a higher luminance.

An SLD described in Patent Literature 1 is provided with a linear ridge waveguide formed perpendicularly to a cleavage end surface and a curved guide active layer provided so as to be curved continuously thereto in a plan view. On the cleavage end surface, an AR (anti-reflection) film is formed in some cases.

In the SLD having such a structure, a most part of light generated in an active layer immediately below the linear ridge waveguide travels toward the curved guide active layer. The light that travels toward the curved guide active layer is divided into light that leaks due to a curve of the layer, light guided to an end surface (end surface opposite to the cleavage end surface) and reflected on the end surface, and light absorbed during being guided.

With this structure, the light that leaks due to the curve and the light that is reflected on the opposite end of the cleavage end surface cannot be returned to the linear active layer, so a laser mode oscillation can be suppressed (see, for example, a lower right column of p. 2 to an upper left column of p. 3 and FIG. 1 in Patent Literature 1).

In brief, unlike a normal laser diode (LD) having a structure in which light is reciprocated and resonated by mirrors provided on both end surfaces, the SLD has a structure in which light is caused to travel on one way by a waveguide and amplified (simulated emission is performed). Those are different in that a spectrum width of a wavelength of output light of the SLD is significantly wider than that of the LD.

Patent Literature 2 discloses a structure of a semiconductor laser (not SLD). In the semiconductor laser, an upper portion of a p-type clad layer as a second clad layer is constituted of a ridge unit and a wing unit, and between the ridge unit and the wing unit, a groove formed from an upper surface of the p-type clad layer to an inner portion thereof is formed.

For a width in a lateral direction (direction orthogonal to a light emission direction) of each of the ridge unit and the groove, a groove width in a rear end surface side area is smaller than a groove width in a front end surface side area. With this structure, a radiation loss of high-order transverse mode light is reduced (see, for example, paragraphs [0036], [0058], and [0077] of description, and FIGS. 1 and 2 in Patent Literature 2).

CITATION LIST

Patent Literature

[Patent Literature 1] Japanese Patent Application Laid-open No. HEI2-310975
[Patent Literature 2] Japanese Patent Application Laid-open No. 2013-4855

DISCLOSURE OF INVENTION

Technical Problem

In a light emission element such as a laser, an SLD, and the like, it is possible to achieve a high output by increasing an energized area, for example, increasing a stripe width. When the stripe width is increased, a width in which light is confined is increased, and an emission beam spot size is increased. When the light emission element as described above is used as a light source of a projector, a resolution is degraded due to the large beam spot size.

In the configuration described in Patent Literature 1 described above, by using the curved guide active layer (waveguide), the rear (cleavage end surface) side is set to be perpendicular to the end surface to increase a use efficiency of light, and an optical axis is tilted from the end surface on the front (light emission surface) side to suppress a resonance of light, with the result that a wide stripe width and a high output are achieved.

However, in the curved guide active layer, a waveguide loss exists due to a curvature of an arc portion thereof. In order to suppress the waveguide loss, it is necessary to increase a curvature radius and cause the curved guide active layer to be close to be a straight line. However, an increase of the curvature radius causes an angle formed with the end surface to be close to be 90 degrees. Therefore, there is a problem in that it is impossible to perform laser oscillation suppression which is absolutely necessary for the SLD.

In view of the circumstances as described above, an object of the present technology is to provide an optical element and a display apparatus capable of reducing a waveguide loss and achieving laser oscillation suppression and high output.

Solution to Problem

To achieve the object described above, an optical element according to an embodiment of the present technology includes a substrate, a first end which is a light emission end, and a second end provided on an opposite side to the first end, the optical element including a first electrode layer, a first semiconductor layer, a second semiconductor layer, an active layer, and a second electrode layer.

The first electrode layer has a stripe form, the first electrode layer being extended from the second end toward the first.

The first semiconductor layer has a first conductivity type and includes a current injection area formed by the first electrode layer and a non-current injection area.

The second semiconductor layer has a second conductivity type and is provided on the substrate.

The active layer is provided between the first semiconductor layer and the second semiconductor layer.

The second electrode layer is in contact with the substrate or the second semiconductor layer.

A waveguide structure included in the first conductivity type layer, the active layer, and the second conductivity type layer includes a first area having a first waveguide configured by the current injection area and the non-current injection area, and having a first refractive index difference as a difference between a refractive index of the current injection area and a refractive index of the non-current injection area, and a second area provided between the first area and the first end, the second area having a second waveguide provided to be extended from the first waveguide toward the first end, and having a second refractive index difference larger than the first refractive index difference as a difference between a refractive index of the second waveguide and a refractive index of an area around the second waveguide in the second area.

The second waveguide has a tapered structure that makes a beam spot of light incident from the first waveguide smaller.

The optical element includes a reflection surface that is formed by an excavation structure provided from the first semiconductor layer to the active layer on at least one of the first end and the second end, and reflects light incident from the first waveguide or the second waveguide.

With this configuration, in the case where the excavation structure is provided on the second end, light incident from the first waveguide is reflected by the reflection surface to the first waveguide. Thus, even in the case where the first waveguide is not perpendicular to the end surface of the second end, the reflection surface can be caused to be perpendicular to the first waveguide. Thus, it is possible to substantially all the light amount of light incident from the first waveguide to the first waveguide, and cause the light to be emitted from the light emission end. Further, in the case where the excavation structure is provided on the first end, the reflection surface can tilt the optical axis of light incident from the second waveguide to the reflection surface, which makes it unnecessary to change a light travelling direction by the first waveguide. As a result, it is possible to efficiently emit light generated in the first waveguide from the optical element and achieve a high output of the optical element.

An optical axis of light emitted from the optical element may be non-perpendicular to an end surface of the first end.

By tilting the optical axis of the light emitted from the optical element with respect to the end surface of the first end, it is possible to prevent light reflected on the end surface from being incident on the first waveguide, that is, prevent a laser oscillation from occurring.

The first waveguide may have a linear form.

By causing the first waveguide to have the linear form, it is possible to reduce a waveguide loss which is caused in a curved waveguide and improve a light output.

The first waveguide may be extended along a direction that is non-perpendicular to an end surface of the first end, the excavation structure may be provided on the second end, and the reflection surface may reflect light incident from the first waveguide toward the first waveguide.

By configuring the first waveguide to be linearly extended along the direction non-perpendicular to the end surface of the first end, it is possible to set the optical axis of the light emitted from the first waveguide to be non-perpendicular to the end surface of the first end. Further, by causing the reflection surface formed by the excavation structure to reflect, toward the first waveguide, light that travels toward an opposite side to the light emission end (first end) in the first waveguide, it is possible to increase a light amount of light emitted from the light emission end.

The end surface of the first end and an end surface of the second end may be parallel to each other, and the reflection surface may be configured to be perpendicular to an optical axis of light emitted from the first waveguide, and to be non-parallel to the end surface of the second end.

With this configuration, even in the case where the first waveguide is extended along the direction non-perpendicular to the end surfaces of the first end and the second end, by the reflection surface perpendicular to the optical axis of light that travels in the first waveguide, it is possible to return, to the first waveguide, substantially all the amount of light that is incident from the first waveguide to the reflection surface.

The first waveguide may be extended along a direction perpendicular to an end surface of the first end, the excavation structure may be provided on the first end, and the reflection surface may tilt the light incident from the second waveguide in such a manner that an optical axis is non-perpendicular to the end surface of the first end.

With this configuration, even in the case where the first waveguide is extended along a direction perpendicular to the end surface of the first end, and the optical axis of light that travels in the second waveguide is parallel to the direction, the optical axis of light is tilted by the reflection surface, so it is possible to prevent light reflected by the end surface of the first end from being incident on the first waveguide, that is, prevent a laser oscillation from occurring.

The reflection surface may be non-perpendicular to an optical axis of light emitted from the second waveguide, and may be non-parallel to the end surface of the first end.

With this configuration, even in the case where the optical axis of light that is incident on the reflection surface is perpendicular to the end surface of the first end, the optical axis of light that is emitted from the reflection surface is non-perpendicular to the end surface of the first end.

The optical axis of light emitted from the optical element may be tilted with respect to a perpendicular of the end surface of the first end by 3 degrees or more.

If the tilt angle is smaller than 3 degrees, reflection light from the end surface of the first end returns to the second waveguide. For this reason, it is preferable that the angle be 3 degrees or more.

The reflection surface may be covered with a dielectric film.

The reflection surface may be covered with a metal film.

The optical element may be a super luminescent diode.

To achieve the object described above, a display apparatus according to an embodiment of the present technology includes the optical element and an image generation unit.

the image generation unit is capable of two-dimensionally scanning light emitted from the optical element, and controlling luminance caused by the light to be projected on a basis of image data.

Advantageous Effects of Invention

As described above, according to the present technology, it is possible to provide the optical element and the display apparatus capable of reducing the waveguide loss and achieving laser oscillation suppression and a high output. It should be noted that the effects described herein are not particularly limited, and any effect described in this disclosure may be exerted.

MODE(S) FOR CARRYING OUT THE INVENTION

Figure 1:
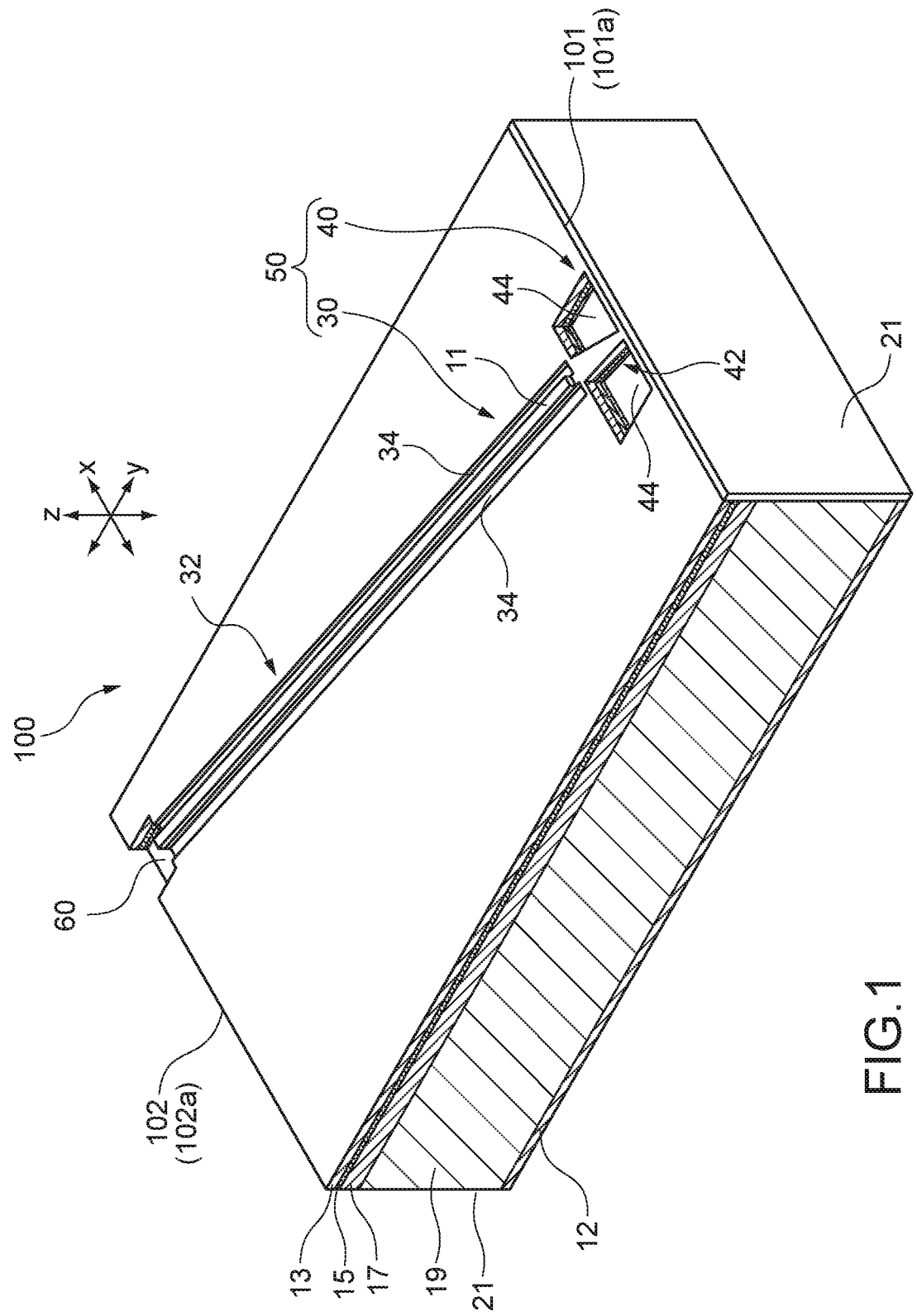
FIG. 1 A perspective view showing an optical element according to an embodiment of the present technology.

Hereinafter, embodiments according to the present technology will be described with reference to the drawings. In the following description, in the case of referring to the drawings, to indicate a direction or a position of an element or a part, words of "up", "down", "left", "right", "vertical", "horizontal", and the like are used in some cases. These are only words for convenience of explanation. That is, those words are used for ease of understanding explanation in many cases. The words may not coincide with a direction and a position in a situation in which an element and an apparatus are actually manufactured or used in some cases.

1. Optical Element

1. 1) Configuration of Optical Element

Figure 2:
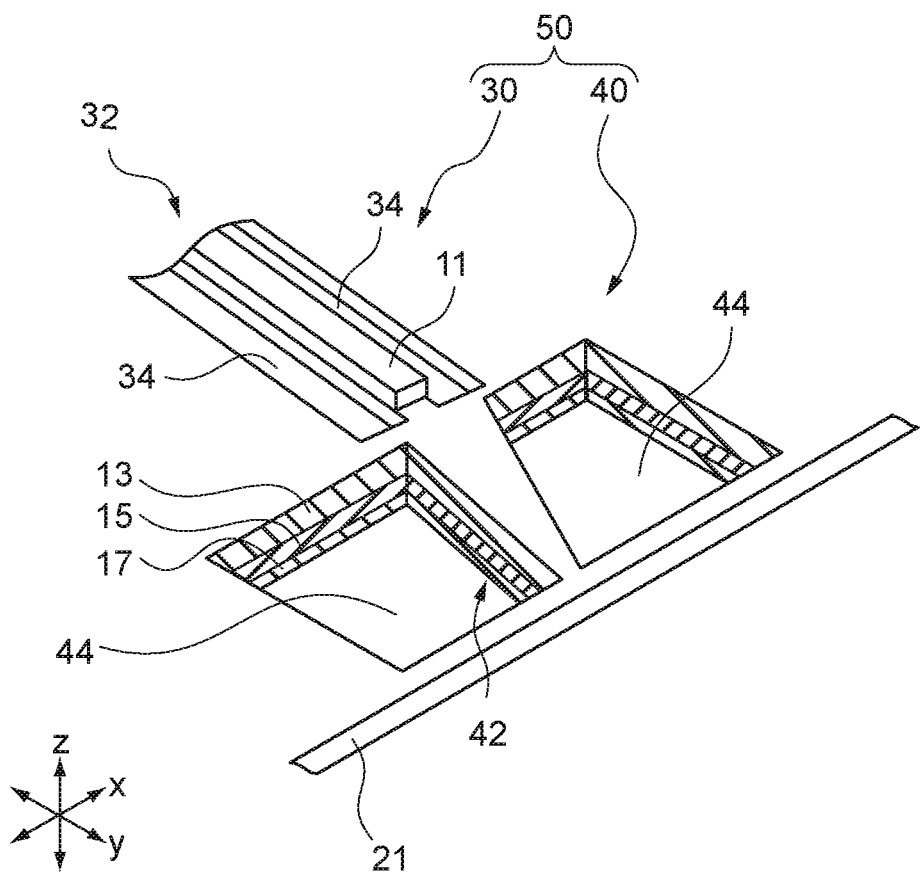
FIG. 2 A perspective view showing a part of the optical element shown in FIG. 1 in an enlarged manner.
Figure 3:
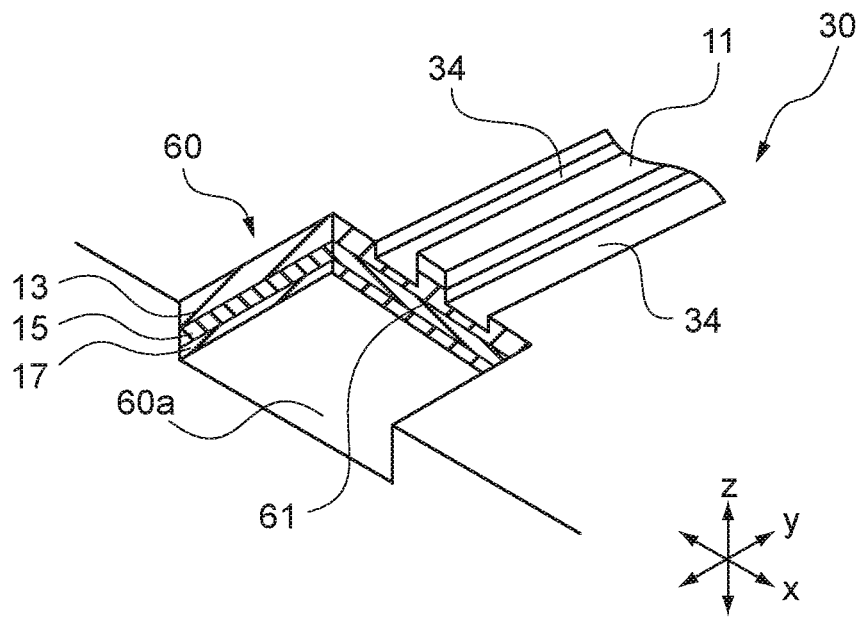
FIG. 3 A perspective view showing a part of the optical element shown in FIG. 1 in an enlarged manner.
Figure 4:
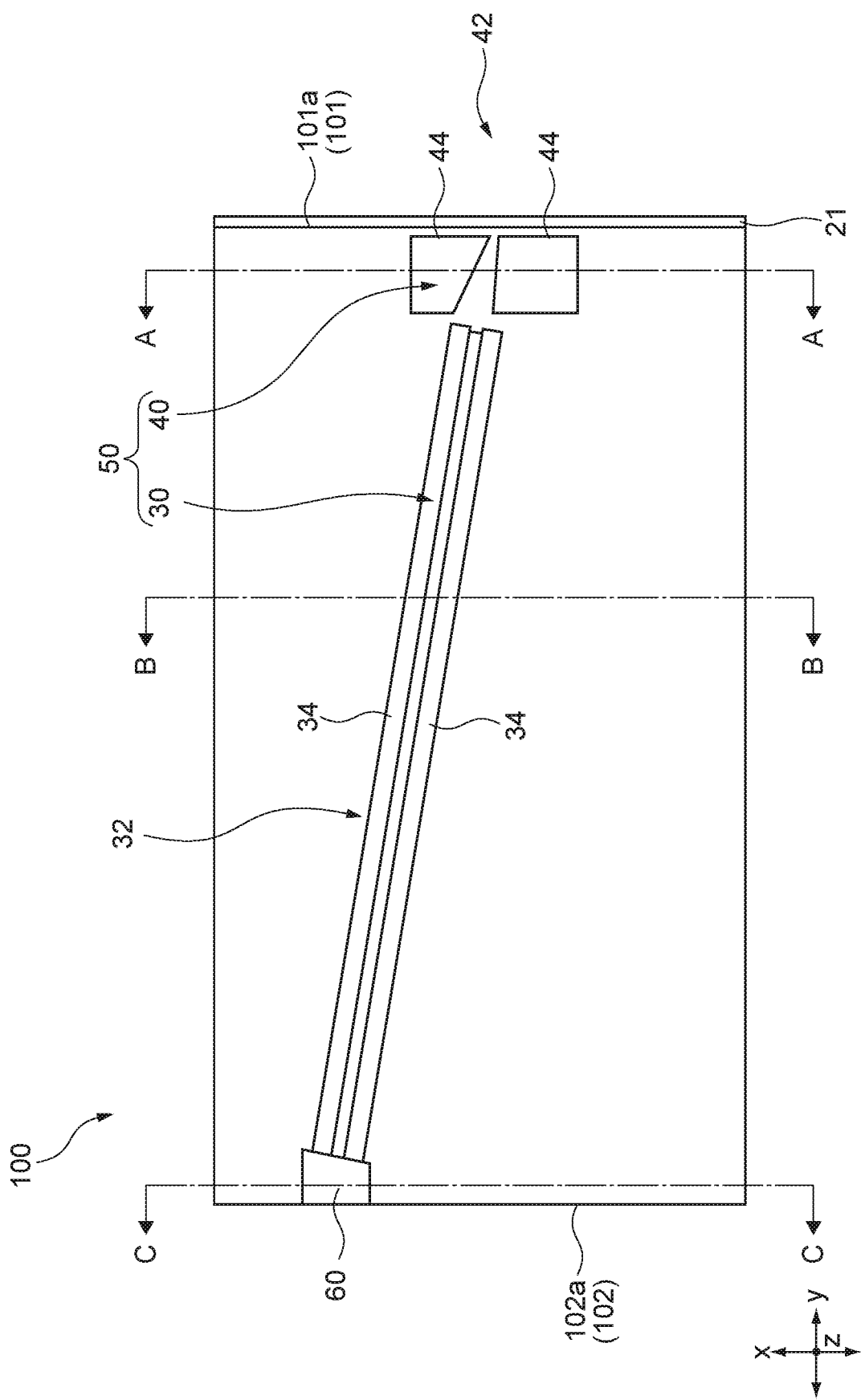
FIG. 4 A plan view showing the optical element shown in FIG. 1.

FIG. 1 is a perspective view showing an optical element 100 according to an embodiment of the present technology. FIG. 2 and FIG. 3 are enlarged views of FIG. 1, and FIG. 4 is a plan view showing the optical element 100. The optical element 100 according to this embodiment is a super luminescent diode (SLD) provided with a ridge type waveguide. In FIG. 1, in a left part, a cross section of a semiconductor layer in the optical element 100 is mainly shown in an enlarged manner.

As shown in FIG. 1 to FIG. 3, the optical element 100 includes, from an upper layer side, a first electrode layer 11, a first semiconductor layer 13, an active layer 15, a second semiconductor layer 17, a substrate 19, and a second electrode layer 12 in order. The first semiconductor layer 13 has, for example, a conductivity type of a p type, and the second semiconductor layer 17 has, for example, a conductivity type of an n type. Referring to also FIG. 6 makes it easy to understand structures of respective layers.

The first semiconductor layer 13 includes a clad layer and a guide layer (not shown herein) formed in order from the first electrode layer 11 side. The second semiconductor layer 17 includes a clad layer and a guide layer (not shown herein) formed in order from the substrate 19 side. The second electrode layer 12 is provided in contact with a back surface of the substrate 19.

It should be noted that the first semiconductor layer 13 may include a contact layer in an area in contact with the first electrode layer 11. Further, an n-type buffer layer may be provided between the substrate 19 and the second semiconductor layer 17. The second electrode layer 12 may be provided directly in contact with the second semiconductor layer 17.

The optical element 100 includes a light emission end (first end) 101 and a rear end 102, which is an end opposite thereto (second end). Hereinafter, an end surface of the light emission end 101 is set as a light emission end surface 101a, and an end surface of the rear end 102 is set as a rear end surface 102a. On the light emission end surface 101a, a dielectric film 21 is provided. As the dielectric film 21, a dielectric film having a low reflectance is used.

In the following, for convenience of explanation, a longitudinal direction of the optical element 100 is set as y direction, a direction orthogonal thereto is set as an x direction. Further, a direction perpendicular to the x and y directions is set as a z direction.

Figure 5:
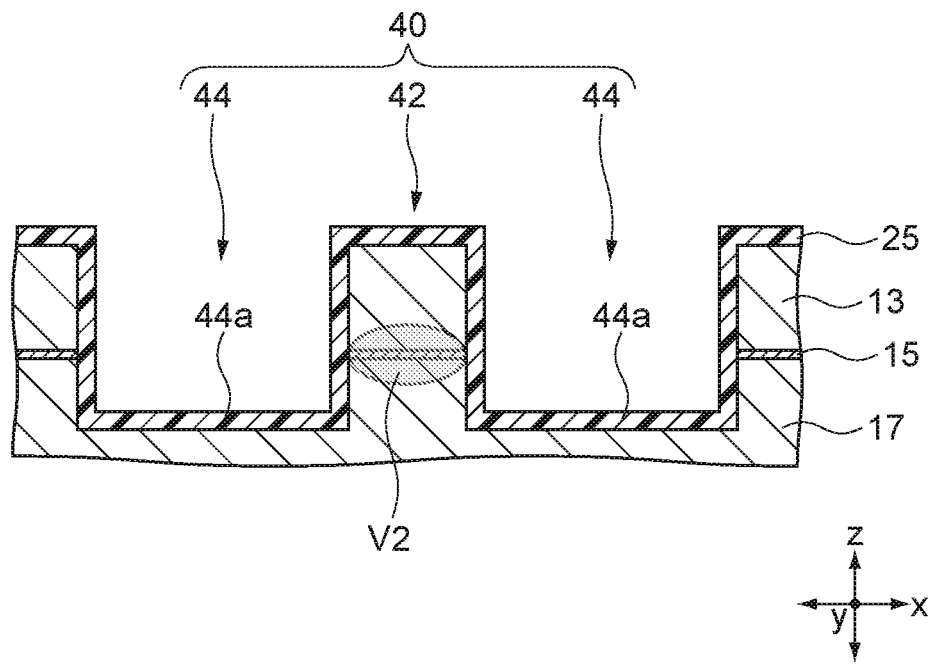
FIG. 5 A cross-sectional view taken along a line A-A shown in FIG. 4.
Figure 6:
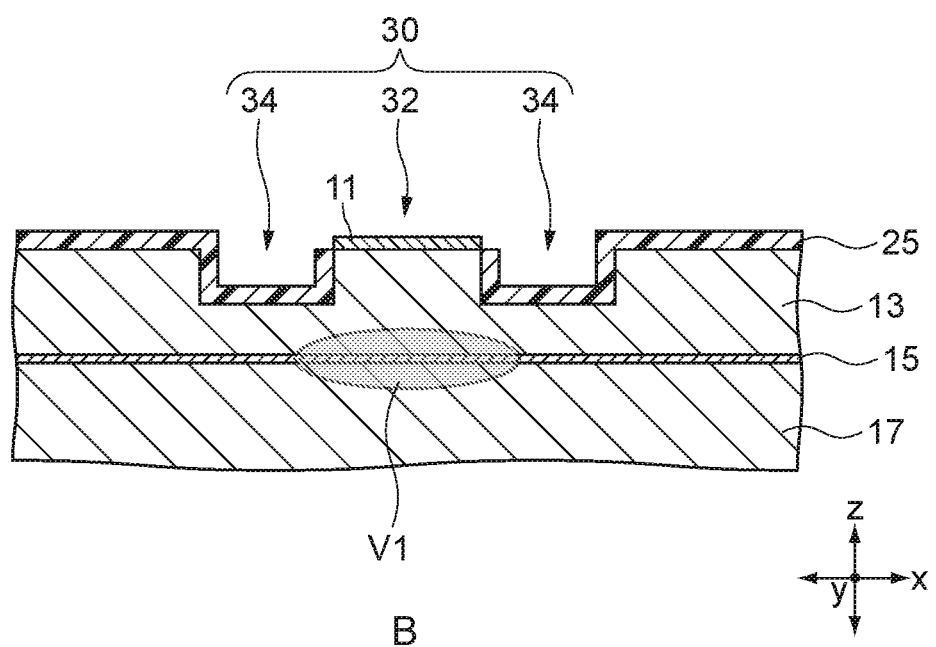
FIG. 6 A cross-sectional view taken along a line B-B shown in FIG. 4.
Figure 7:
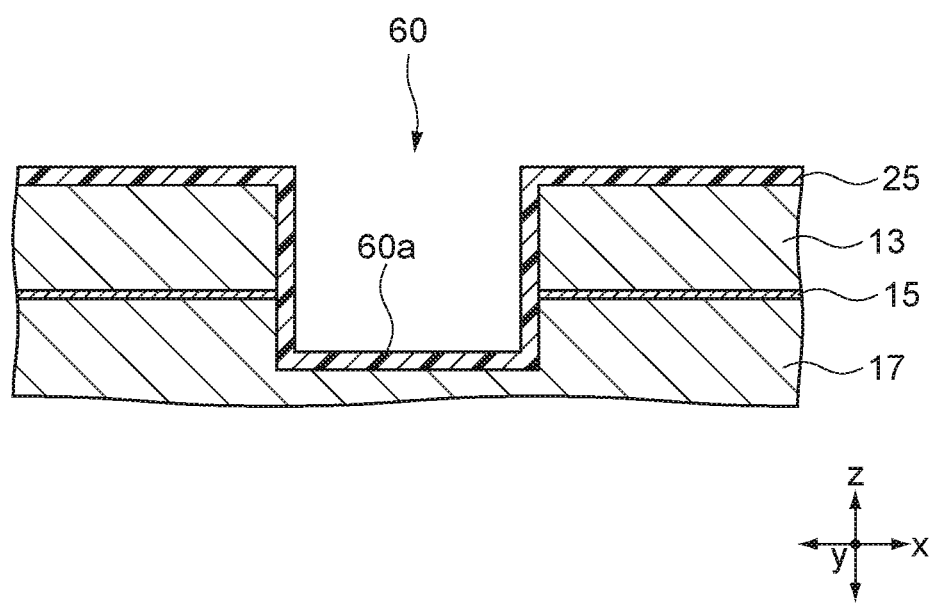
FIG. 7 A cross-sectional view taken along a line C-C shown in FIG. 4.

FIG. 5 to FIG. 7 each are a cross-sectional views of each portion of the optical element 100. FIG. 5 is a cross-sectional view taken along a line A-A of FIG. 4, FIG. 6 is a cross-sectional view taken along a line B-B of FIG. 4, and FIG. 7 is a cross-sectional view taken along a line C-C of FIG. 4. It should be noted that in FIG. 5 to FIG. 7, on a surface of an upper portion of the optical element 100, a dielectric layer 25 is provided. In FIG. 1 to FIG. 4, the dielectric layer 25 are not shown.

As shown in FIG. 1 and FIG. 4, in the optical element 100, a waveguide structure 50 and an excavation structure 60 are provided. The excavation structure 60 is provided on the rear end 102, and the waveguide structure 50 is configured in a stripe form extended from the excavation structure 60 toward the light emission end 101.

The waveguide structure 50 is formed of the first semiconductor layer 13, the active layer 15, and the second semiconductor layer 17, and is configured so as to be divided into a first area 30 and a second area 40 in the y direction, which is a longitudinal direction of the optical element 100.

As shown in FIG. 4, the first area 30 of the waveguide structure 50 is a waveguide structure provided from the excavation structure 60 to a predetermined position along a direction tilted with respect to the y direction. The second area 40 of the waveguide structure 50 has a waveguide structure provided in an area from an end portion on the light emission end 101 side of the first area 30 to the light emission end 101. That is, the second area 40 is provided between the first area 30 and the light emission end 101.

As shown in FIG. 6, by the first electrode layer 11, mainly in the first semiconductor layer 13, a current injection area is formed. The first area 30 of the waveguide structure 50 includes a first waveguide 32 configured by the current injection area and a non-current injection area which is provided around the first waveguide 32 and in which a current injection is not performed. The first waveguide 32 is mainly configured by the ridge unit. The non-current injection area is mainly configured as a first depressed portion 34 provided so as to sandwich the first waveguide 32. That is, in the first area 30, so-called a double ridge (w-ridge) structure is formed.

In the first semiconductor layer 13, a current is dispersed from the first electrode layer 11 toward the active layer 15 so as to be expanded to some extent. In the first area 30, an area in which a current passes in the first semiconductor layer 13 (and second semiconductor layer 17) is referred to as a current injection area herein, and a remaining area is referred to as a non-current injection area. That is, the current injection area and the non-current injection area constitute a current confined structure. With the first area 30 of the waveguide structure 50, it is possible to increase a current density. In a restricted area as indicated by a sign V1 of FIG. 6, a light beam with a high output is generated.

As a difference between a refractive index of light in the current injection area (first waveguide 32) and a refractive index of light in the non-current injection area (first depressed portion 34), a first refractive index difference is generated. The first refractive index difference is a value calculated as an equivalent refractive index difference which is varied depending on a depth of the first depressed portion 34.

As shown in FIG. 5, the second area 40 of the waveguide structure 50 includes a second waveguide 42 provided so as to be extended from the first waveguide 32 toward the light emission end 101 and a second depressed portion 44 provided so as to sandwich the second waveguide 42.

The second waveguide 42 is configured by a protrusion portion which is extended from the first waveguide 32 and is formed of a semiconductor. In the second waveguide 42, the first electrode layer 11 is not provided. A depth of the second depressed portion 44 is more than the depth of the first depressed portion 34 in the first area 30.

In the second area 40 configured as described above, as a difference between a refractive index of light in the second waveguide 42 and a refractive index of light in the second depressed portion 44, a second refractive index difference is generated. The second refractive index difference is a value calculated as an equivalent refractive index difference which is varied depending on the depth of the second depressed portion 44.

The depths of the first depressed portion 34 and the second depressed portion 44 are designed in such a manner that the second refractive index difference is larger than the first refractive index difference in the first area 30. As described above, the depth of the second depressed portion 44 is formed so as to be more than the depth of the first depressed portion 34, with the result that it is possible to design the second refractive index difference so as to be larger than the first refractive index difference. With the waveguide structure 50 as described above, a light confinement action is generated as indicated by a sign V2 of FIG. 5.

As shown in FIG. 5, typically, a depth of the second depressed portion 44 is set so as to have a bottom surface 44a on a position deeper than the active layer 15. With this structure, it is possible to increase a difference between the first refractive index difference and the second refractive index difference.

It should be noted that as described above, respective surfaces of the first depressed portion 34 and the second depressed portion 44 are covered with the dielectric layer 25. Further, on the dielectric layer 25, a metal layer including the first electrode layer 11 is formed. The metal layer is insulated from the first semiconductor layer 13 by the dielectric layer 25 except a part serving as the first electrode layer 11.

As shown in FIG. 7, the excavation structure 60 is a depressed shape structure formed by depressing the first semiconductor layer 13, the active layer 15 and the second semiconductor layer 17. The excavation structure 60 is formed in such a manner that a bottom surface 60a is deeper than the active layer 15. It should be noted that the depth of the bottom surface 60a may be set to a depth different from the bottom surface 44a of the second depressed portion 44. The excavation structure 60 and the second depressed portion 44 can be formed by the same manufacturing process, and thus those are set to a position of the same depth typically.

Figure 8:
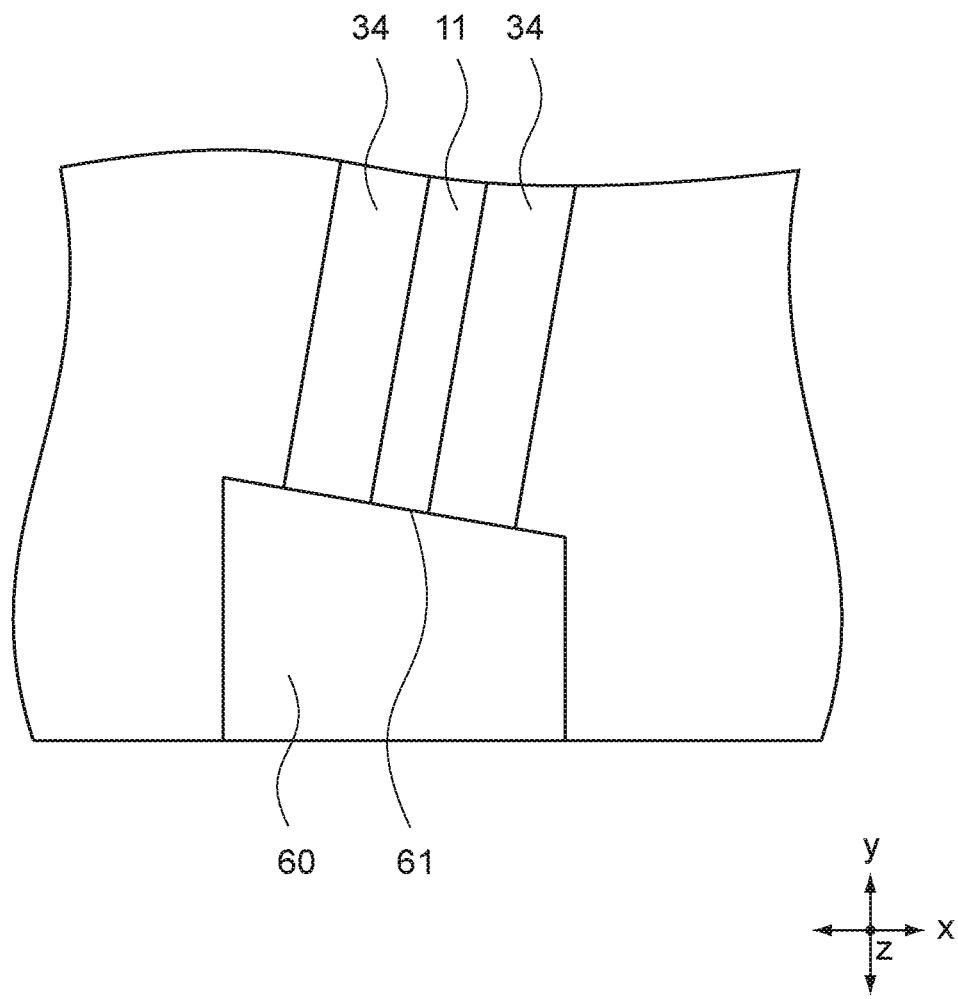
FIG. 8 A plan view showing a part of the optical element shown in FIG. 1 in an enlarged manner.

FIG. 8 is a plan view showing the excavation structure 60 in an enlarged manner. As shown in FIG. 3 and FIG. 8, by the excavation structure 60, a reflection surface 61 which the first waveguide 32 faces is formed. As shown in the figures, the reflection surface 61 is a surface orthogonal to an extension direction of the first waveguide 32. The first waveguide 32 is provided along a direction tilted with respect to a longitudinal direction (y direction) of the optical element 100, so the reflection surface 61 is a surface in non-parallel to the end surface (light emission end surface 101a and rear end surface 102a) of the optical element.

Figure 9:
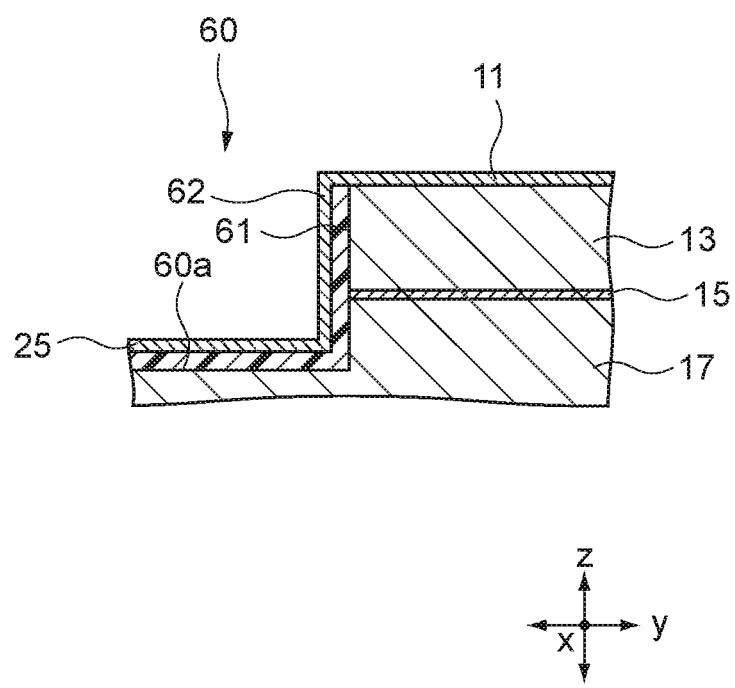
FIG. 9 A cross-sectional view showing a part of the optical element shown in FIG. 1 in an enlarged manner.

FIG. 9 is a cross-sectional view of the reflection surface 61. As shown in the figure, on the reflection surface 61, the dielectric layer 25 and a metal layer 62 are formed. The dielectric layer 25 is the same layer as the dielectric layer 25 shown in FIG. 5 to FIG. 7 and covers the reflection surface 61. The metal layer 62 is the same layer as the first electrode layer 11 shown in FIG. 6 and covers the dielectric layer 25.

Light is incident on the reflection surface 61 from the first waveguide 32 as will be described later, and the incident light is reflected toward the first waveguide 32 by the dielectric layer 25 and the metal layer 62.

1. 2) Operation of Optical Element

As described above, when the first electrode layer 11 forms the current injection area mainly on the first semiconductor layer 13, light is generated on the first waveguide 32. An area close to the rear end 102 in the first waveguide 32 is an area in which a carrier recombination occurs in the active layer 15, and light (spontaneously emitted light) is generated. Hereinafter, the area is referred so as an "LED area" for convenience sake. On the other hand, an area close to the second waveguide 42 in the first waveguide 32 is an area in which spontaneously emitted light by the carrier recombination is generated, and the spontaneously emitted light is amplified. Hereinafter, the area is referred to as an "optical amplification area" for convenience sake.

Light generated in the LED area of the first waveguide 32 is propagated in the first waveguide 32. Out of the light, light that travels toward the rear end 102 is reflected by the reflection surface 61, and travels toward the light emission end 101. The light that travels toward the light emission end 101 is incident on the second waveguide 42, and travels in the second waveguide 42 toward the light emission end 101. The second refractive index difference of the second area 40 is larger than the first refractive index difference of the first area 30, so an action of light confinement is promoted. The light that travels in the second waveguide 42 is emitted from the light emission end 101.

Here, in a laser diode (LD), generated light is reflected on the end surface repeatedly, thereby amplifying (performing laser oscillation for) light with a specific wavelength. Thus, coherent light (laser light) with a narrow spectrum width is emitted. In contrast, in the SLD, the generated light is not reflected on the end surface on a light emission side, and low-coherent light having a broad spectrum is emitted.

Thus, in the optical element 100, light reflected on the light emission end 101 is not used. If light reflected on the light emission end 101 reaches the first waveguide 32 through the second waveguide 42, a laser oscillation is caused, laser light is generated. For this reason, in the optical element 100, a configuration is required in which light reflected on the light emission end 101 does not reach the first waveguide 32.

1. 3) Action of First Waveguide

As shown in FIG. 3, the first waveguide 32 is extended in a straight line form along a direction tilted with respect to the longitudinal direction (Y direction) of the optical element 100, and an extended line of a center line of the first waveguide 32 is configured so as not to be perpendicular to the light emission end surface 101a and the rear end surface 102a.

An end portion of the first waveguide 32 on the rear end surface 102a side faces the reflection surface 61 formed by the excavation structure 60, and the reflection surface 61 is a surface perpendicular to the extended line of the center line of the first waveguide 32. Therefore, light that reaches the reflection surface 61 from the first waveguide 32 and is reflected on the reflection surface 61 are substantially entirely reflected toward the first waveguide 32.

Because the first waveguide 32 is extended in the straight line form along the direction tilted with respect to the longitudinal direction (y direction) of the optical element 100, if the excavation structure 60 is not provided, light that reaches the rear end surface 102a from the first waveguide 32 is incident on the rear end surface 102a obliquely. Thus, even if a reflection film is provided on the rear end surface 102a, light that is incident on the reflection film from the first waveguide 32 is not incident on the first waveguide 32.

In contrast, by providing the reflection surface 61, it is possible to substantially entirely return light incident from the first waveguide 32 to the first waveguide 32 and use the light effectively.

Further, by providing the first waveguide 32 in the straight line form, it is possible to prevent a waveguide loss in the first waveguide 32. From the past, in the SLD, an optical axis of emitted light of the SLD is tilted with respect to a light emission end surface to prevent an oscillation of laser transmission. Therefore, a structure is used in which a waveguide corresponding to the first waveguide 32 is extended in a curved line form. In this case, a leakage of light (waveguide loss) is caused due to the curved form of the waveguide.

It should be noted that the first waveguide 32 is not limited to have the straight line form and may be partially or entirely extended in a curved form. In this case, the reflection surface 61 is also tilted with respect to the rear end surface 102a, the curvature can be reduced as compared to the case where the excavation structure 60 is not provided, and the waveguide loss can be reduced.

1. 4) Action of Second Waveguide

Figure 10:
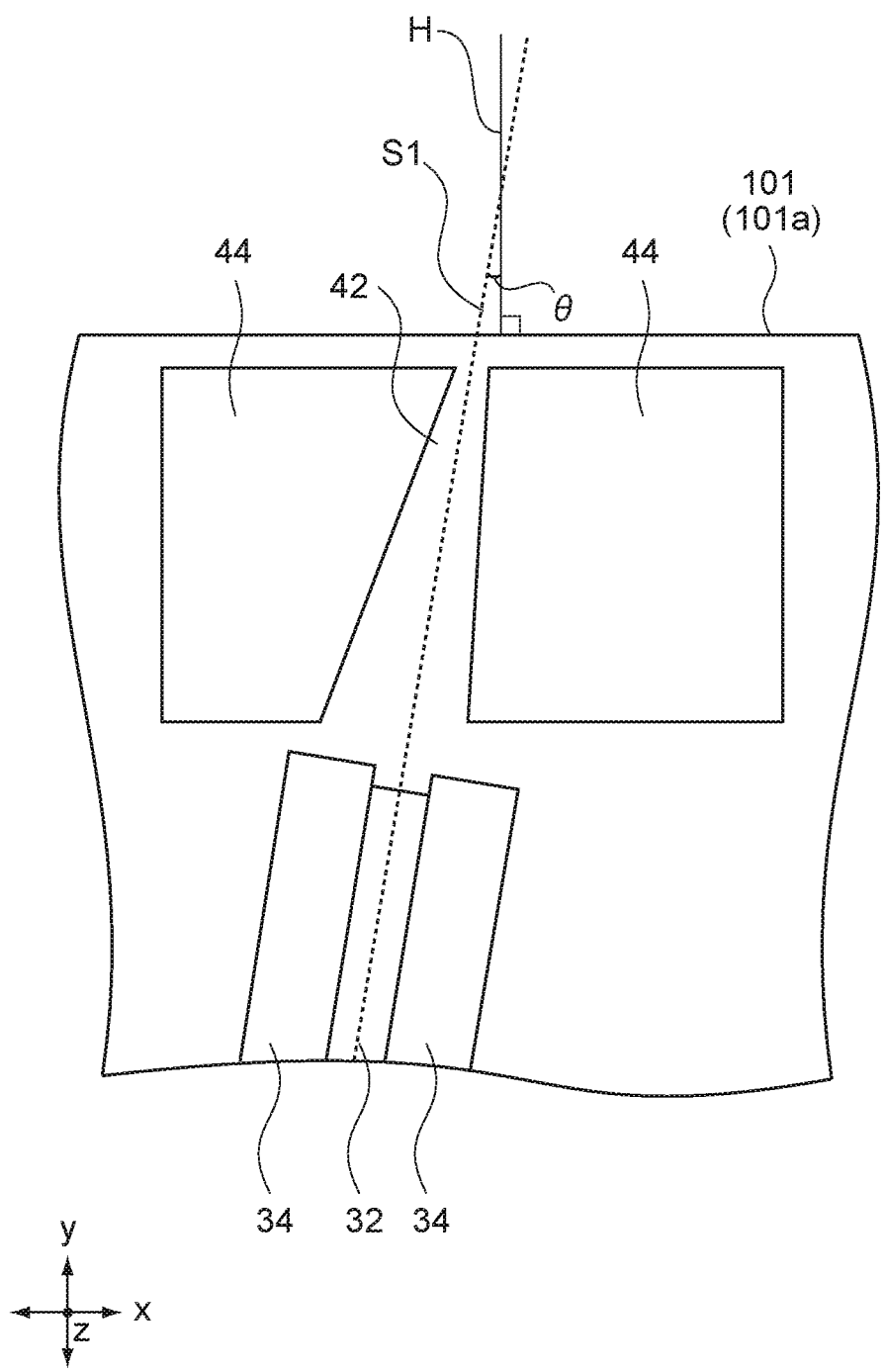
FIG. 10 A plan view showing a part of the optical element shown in FIG. 1 in an enlarged manner.

FIG. 10 is a schematic diagram showing a configuration of the second waveguide 42 and is an enlarged view of FIG. 4. It should be noted that the dielectric film 21 of the light emission end surface 101a is not shown in those figures. FIG. 10 shows an optical axis S1 of light that is incident from the first waveguide 32 and emitted from the second waveguide 42.

As shown in FIG. 10, the second waveguide 42 has a tapered structure in which a width thereof is gradually reduced as approaching the light emission end surface 101a, and a beam spot of light that is incident from the first waveguide 32 is made to be small. Light that is incident on the second waveguide 42 is collected with the optical axis S1 as a center, while being reflected on an interface between the second waveguide 42 and the second depressed portion 44.

As described above, because the first waveguide 32 is extended along a direction tilted with respect to the longitudinal direction (y direction) of the optical element 100, from the light emission end surface 101a, light is emitted in a direction that is non-perpendicular to the light emission end surface 101a. Therefore, light reflected on the light emission end surface 101a is prevented from being incident on the second waveguide 42, that is, laser oscillation of reflection light is prevented. As shown in FIG. 10, when a perpendicular of the light emission end surface 101a is set as line H, the optical axis S1 is tilted with respect to the line H. It is preferable that a tilt angle (θ in the figure) thereof be 3 to 15 degrees inclusive, typically, 5 degrees.

This is because, when a light emission angle θ is smaller than 3 degrees, reflection light from the light emission end surface 101a is returned to the first waveguide 32, and a laser oscillation occur. A combination coefficient is $10^{-5}$ as a guide. Further, when the light emission angle θ is larger than 15 degrees, the angle approaches an angle of total reflection, and thus an emission light amount is reduced.

1. 5) Size of Optical Element

Figure 11:
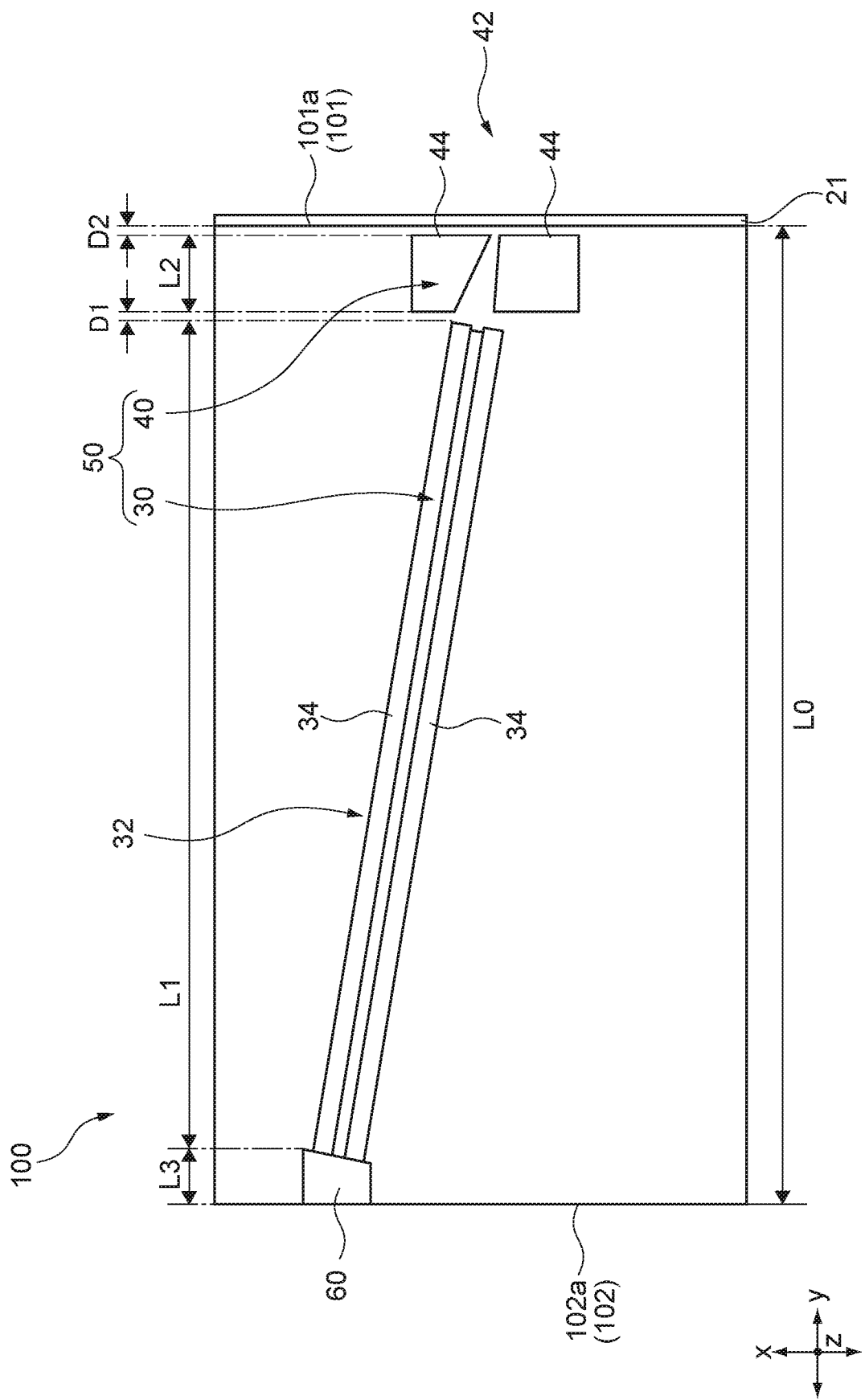
FIG. 11 A schematic view showing a size of each part of the optical element shown in FIG. 1.
Figure 12:
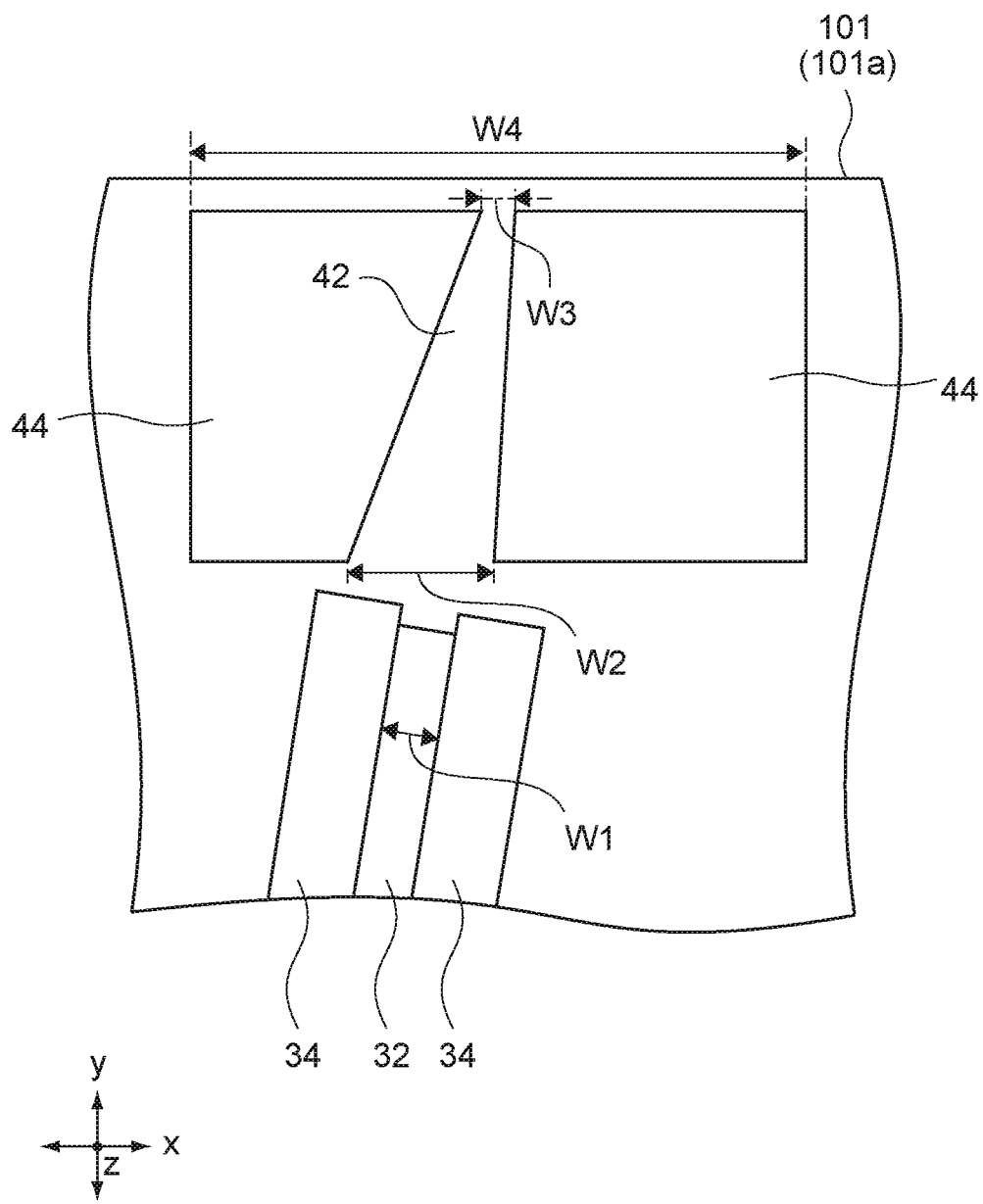
FIG. 12 A schematic view showing a size of each part of the optical element shown in FIG. 1.

FIG. 11 and FIG. 12 each are a schematic view showing a size of each portion of the optical element 100. An entire length L0 (of a semiconductor element) of the optical element 100 is, for example, 1000 μm to 4000 μm inclusive, typically, 2200 μm. The entire length L0 is not limited to this range. It should be noted that the entire length L0 may be a length including a thickness of the dielectric film 21 of each of both ends.

A length L1 of the first waveguide 32 in the y direction is designed to be such a length that amplification of the spontaneously emitted light by the carrier recombination is sufficiently obtained. For example, the length L1 is 1000 µm to 4000 µm inclusive.

A length L2 of the second waveguide 42 in the y direction is designed in such a manner that an angle (angle with respect to y axis viewed in the z direction) of light that is propagated in the second waveguide 42 is smaller than a critical angle determined on the basis of the second refractive index difference. The length L2 is set to 25 µm to 300 µm inclusive, typically, 184 µm, for example.

A length L3 of the excavation structure 60 in the y direction is preferably 10 µm to 100 µm inclusive, typically, 22 µm, for example.

A width W1 of the first waveguide 32 (see FIG. 12) is 3 µm to 12 µm inclusive, for example, and is set to be substantially constant on any position in the longitudinal direction. However, the width W1 does not necessarily have to be constant. More preferably, the width W1 is set to 5 µm to 10 µm inclusive in order to achieve a high output, for example, 5.2 µm.

A width W2 of an end portion of the second waveguide 42 on the first area 30 side is set to 4 µm to 15 µm inclusive, for example, preferably, 6 µm to 12 µm inclusive. The width W1 is typically set to 9.2 µm.

A width W3 of an end portion of the second waveguide 42 on the light emission end 101 side is set to, for example, 1 µm to 10 µm inclusive, preferably, 2 µm to 8 µm inclusive. The width W3 is not particularly limited and only has to be designed to secure a necessary size of a beam spot. The width W3 is typically set to 3.4 µm.

Among the widths W1, W2, and W3, a relationship of W2>W1>W3 is established. In particular, when the width W2 is more than the width W1 of the first waveguide 32, it is possible to reliably guide an entire light amount generated and propagated in the first waveguide 32 in the second waveguide 42, and suppress a light loss.

It should be noted that an entire width W4 (or area in the second depressed portion 44 viewed in the z direction) of the second depressed portion 44 in the x direction is set as appropriate. When a proper difference is provided between the first refractive index difference and the second refractive index difference, the area in the second depressed portion 44 is not limited. The width W4 may be the same as an entire width of the first depressed portion 34 in the first area 30.

Further, as shown in FIG. 11, between the first area 30 and the second area 40, a predetermined interval D1 is provided, and the interval D1 may not be provided (D1=0). Further, between the second area 40 and the light emission end surface 101a, a predetermined interval D2 is provided. This is provided to be used as a cleavage buffer at a time of forming the light emission end surface 101a by a cleavage, and the interval D2 can be set to, for example, 5 µm. Further, the interval D2 may not be provided (D2=0).

Figure 13:
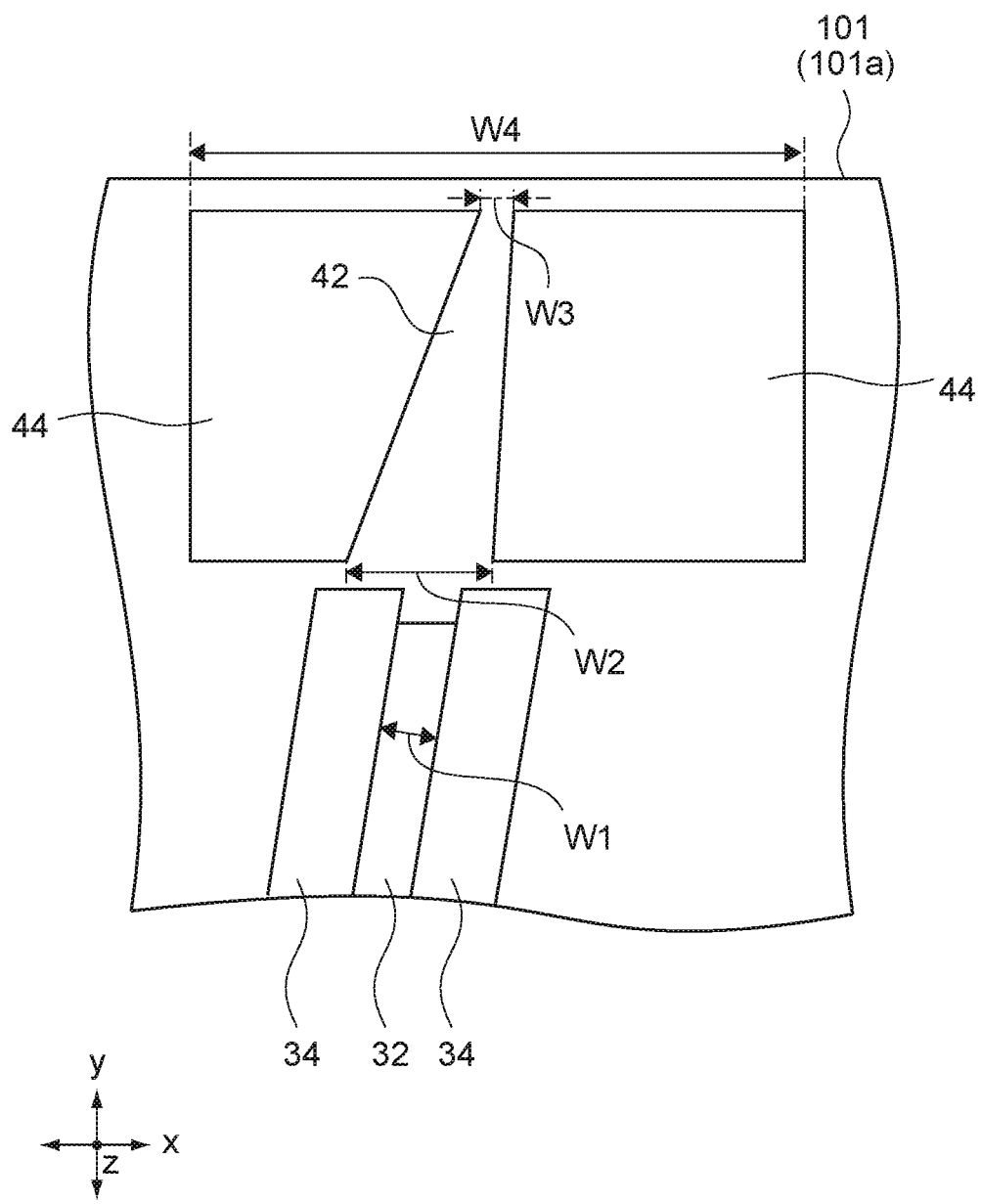
FIG. 13 A schematic view showing a size of the optical element according to an embodiment of the present technology.

Further, as shown in FIG. 13, the end portions of the first waveguide 32 and the second waveguide 42 may be parallel. By setting the end portions of the first waveguide 32 and the second waveguide 42 to be parallel, it is possible to effectively design the width W2 to be a width which causes a less light leakage. Further, in the case where a tilted angle of the first waveguide 32 is large, it is conceived that the first depressed portion 34 and the second depressed portion 44 are overlapped. Setting the end portions of the first waveguide 32 and the second waveguide 42 to be parallel makes those designs easy.

1. 6) Material Example of Element that Configures Optical Element and Manufacturing Method Subsequently, a method of manufacturing the optical element 100 (SLD) according to this embodiment will be described for each of the red SLD, the green SLD, and the blue SLD separately. A manufacturing method and materials to be used described below are merely typical examples and are not limited thereto.

1. 6. 1) Method for Manufacturing Red SLD

Figure 14A:
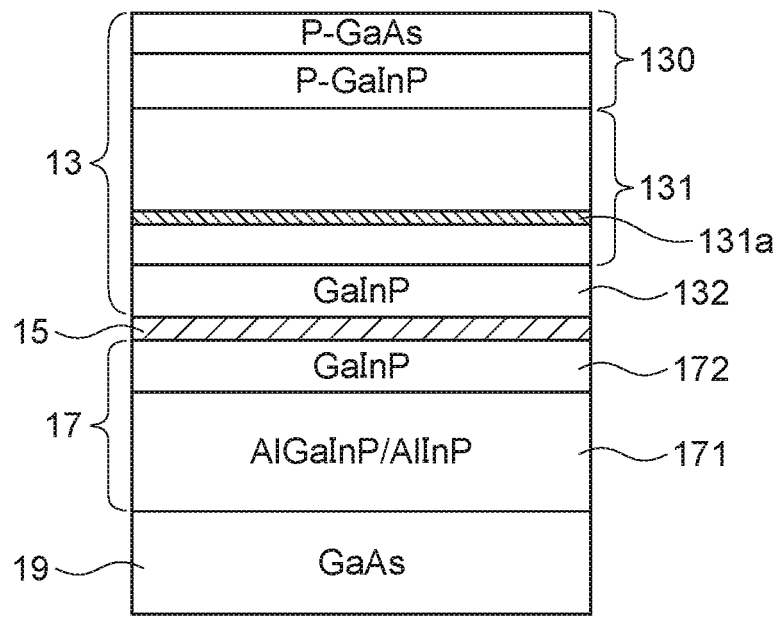
FIG. 14A is a cross-sectional view showing a semiconductor layer for explaining an example of a method of manufacturing a red SLD.
Figure 14B:
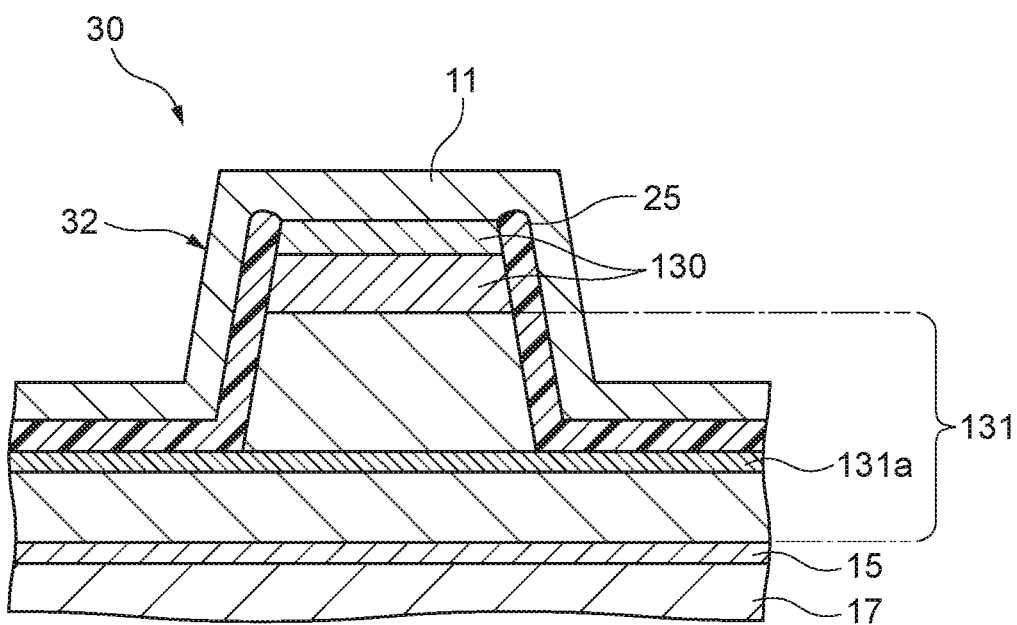
FIG. 14B is a cross-sectional view showing a cross section of a first area, and showing an element in which a first electrode layer is formed after a dielectric layer is formed.

A method of manufacturing the red SLD will be described. FIGS. 14A and 14B are cross-sectional views showing a semiconductor layer of the optical element 100 of the red SLD.

As the semiconductor substrate 19, a GaAs substrate is used. On the GaAs substrate (wafer at this time), the following crystalline structure is formed by an MOCVD (Metal Organic Chemical Vapor Deposition) method.

An n-type clad layer 171 that is made of $Al_{0.5}In_{0.5}P$ and is subjected to Si doping is grown by approximately 3 µm. On the n-type clad layer, a guide layer 172 made of $Ga_xIn_{1-x}P$ is grown by approximately 20 nm. The active layer 15 made of $Ga_xIn_{1-x}P$ or $(Al_xGa_{1-x})_{0.5}In_{0.5}P$ is grown. Normally, the active layer 15 is a multiple quantum well structure. A well width and the number of wells are not particularly defined. A well thickness of the active layer 15 is, for example, approximately 80 Å.

On the active layer 15, a guide layer 132 made of $Ga_xIn_{1-x}P$ is grown by approximately 40 nm. On the layer, a p-type clad layer 131 which is made of $Al_{0.5}In_{0.5}P$ and is subjected to Mg doping is grown.

As the material of the clad layer, a semiconductor having a composition of AlGaInP or the like may be used. A film thickness of the clad layer is, for example, approximately 1.5 µm.

During the growth of the p-type clad layer 131, an etching stop layer 131a made of $Ga_xIn_{1-x}P$ is formed. The etching stop layer 131a only has to be a material having a resistance against wet etching by an ammonium hydrogen-peroxide mixture or the like. A film thickness of the etching stop layer 131a is, for example, approximately 5 nm. It should be noted that the etching stop layer 131a is not shown in FIG. 1 and the like.

On the p-type clad layer 131 including the etching stop layer 131a, a GaInP layer which is subjected to Mg doping is grown. The Mg-doped GaAs layer is grown, and a contact layer 130 is formed.

Subsequently, in an area on the wafer, which corresponds to the light emission end surface 101a and the rear end surface 102a of the optical element 100, a window area (not shown) is formed. This is formed in order to suppress light absorption as much as possible. The window area is formed by a method of dispersion or the like of impurities (for example, Zn) in a semiconductor layer is used, for example. Those window areas do not necessarily have to be provided. Alternately, the window area may be formed on either one of the light emission end surface 101a and the rear end surface 102a.

Subsequently, in the waveguide structure 50, the second area 40 (the second waveguide 42 and the second depressed portion 44) and the excavation structure 60 are formed. Specifically, in a portion corresponding to the second area 40 and the excavation structure 60, a mask opening portion of $SiO_2$ corresponding to a shape of the second depressed portion 44 and the excavation structure 60 is formed by photolithography. Through this opening, etching is performed by dry etching. In a dry etching process, etching is performed up to an intermediate point of the n-type clad layer 171. In the etching process, as described above, on the basis of an equivalent refractive index difference between an inside of the second waveguide 42 and the second depressed portion 44 therearound, an etching depth is controlled.

Subsequently, in the waveguide structure 50, the first area 30 (the first waveguide 32 and the first depressed portion 34) is formed. For example, the first area 30 is formed by photolithography and etching processes. In the etching process, the dry etching is performed so as not to exceed the etching stop layer 131a. Further, in the etching process, by wet etching with an ammonium hydrogen-peroxide mixture or the like, the semiconductor layer that remains on the etching stop layer 131a is removed. As a result, the first area 30 is formed.

Subsequently, the dielectric layer 25 (see FIG. 4 to FIG. 7) is formed. Specifically, by a film formation technology and photolithography, the dielectric layer 25 is formed on a portion except a top portion of the ridge unit. The dielectric layer 25 is formed so as to cover a wall surface of the ridge unit and respective inner surfaces of the first depressed portion 34, the second depressed portion 44, and the excavation structure 60. As a result, the reflection surface 61 is covered with the dielectric layer 25 (see, FIG. 9).

The material of the dielectric layer 25 is $SiO_2$, for example. In addition, the material of the dielectric layer 25 may be Si, SiN, $Al_2O_3$, $Ta_2O_5$, AlN, and the like. The film that configures the dielectric layer 25 may be a single layer film or a multilayer film. The thickness of the dielectric layer 25 is not limited as long as the first depressed portion 34 and the second depressed portion 44 can be protected.

FIG. 14B is a cross-sectional view showing a cross section of the first area 30, and showing an element in which the dielectric layer 25 is formed, and then the first electrode layer 11 is formed. The first electrode layer 11 is formed by the film formation technology and the photolithography. The first electrode layer 11 is formed on at least a top portion of the ridge unit. However, as shown in FIG. 14B, the first electrode layer 11 may be continuously formed on a wall surface and the like of the ridge unit. The metal layer 62 (see FIG. 9) is formed with the first electrode layer 11, and covers the dielectric layer 25 on the reflection surface 61. The materials of the first electrode layer 11 and the metal layer 62 are Ti/Pt/Au from the semiconductor side, for example.

It should be noted that in FIG. 5 and FIG. 6, the shape of the cross section of the ridge unit (cross section taken along a z-x plane) is set to be a rectangle. In actuality, for example, as shown in FIG. 14B, the shape of the cross section of the ridge unit is a trapezoid such that a width of the contact layer as an upper layer is reduced. The cross-sectional shape of the ridge unit may be a rectangle or an inversed trapezoid (trapezoid upside down).

The wafer, which is the GaAs substrate (substrate 19) is thinned by being polished up to a predetermined thickness, and on a back surface of the wafer, the second electrode layer (see FIG. 1) is formed. The second electrode layer 12 is AuGe/Ni/Au from the semiconductor side, for example.

After the second electrode layer 12 is formed, for example, a cleavage is used to process the wafer into a chip shape in a unit of the optical element, and the light emission end surface 101a of the optical element 100 is formed. On the light emission end surface 101a, the dielectric film 21 is formed for the purpose of protection and reflectance suppression. The dielectric film 21 is formed by sputtering or evaporation, for example. Examples of a material of the dielectric film 21 include $SiO_2$, $Al_2O_3$, $Ta_2O_5$, $TiO_2$, and the like. It should be noted that a dielectric film does not necessarily have to be provided on the rear end surface 102a because the reflection surface 61 is provided.

In order to suppress a combination coefficient to the waveguide, a reflectance of the light emission end 101 is set to be equal to or less than 0.3%. On the other hand, a reflectance of the reflection surface 61 is set to be equal to or more than approximately 95%. The reflectances of the light emission end 101 and the reflection surface 61 are not limited to the numerical values. For the light emission end 101, a lower reflectance may be set. Further, for the reflection surface 61, a higher reflectance may be set.

The chip manufactured as described above is mounted on a package used in an LD (Laser Diode) or a predetermined another jig. Examples of a solder material to be used for the mounting include an AuSn alloy, Sn, a silver paste, and the like. Either of the p side and n side of the semiconductor element may be set as the package side for the mounting. However, it is desirable that the p side be set as the package side for the mounting in order to efficiently exhaust heat.

The mounted optical element 100 is connected with a terminal for power supply with an Au wire bond. When necessary, a member for protecting the optical element 100 is mounted, and thus a product is completed.

1. 6. 2) Method of Manufacturing Green SLD and Blue SLD

Subsequently, a method of manufacturing the green SLD and the blue SLD will be described. Here, a description on a similar method to the method of manufacturing the red SLD will be simplified or omitted, and different points will be mainly described.

The method of manufacturing the green SLD and the blue SLD is different from the method of manufacturing the red SLD in that the etching stop layer 131a is not provided. The etching depth is time-controlled. As a semiconductor material of the green SLD, a GaN-based material is used. In this case, wet etching is not performed in many cases, so the etching stop layer 131a is not provided.

In addition, a multilayer structure of crystal is irradiated with laser light, etching is performed to change a film thickness of the multilayer structure, and the reflectance of the laser light is periodically changed. There is a case where a method of detecting a stop position of etching by using this.

Respective layers of the semiconductor layer is configured by the following materials, for example.
 substrate: GaN
 active layer: InGaN
 guide layer: GaN or InGaN
 clad layer: InAlGaN or AlGaN
 contact layer: GaN or AlGaN As a structure and a method of manufacturing the "first area 30" of the green SLD, for example, a structure and a method of manufacturing an LD disclosed in Japanese Patent Application Laid-open No. 2012-174868 is preferable. As a structure and a method of manufacturing the blue SLD, for example, a structure and a method of manufacturing an LD disclosed in Japanese Patent Application Laid-open No. 2010-129763 is preferable.

It should be noted that the green SLD and the blue SLD are discriminated on the basis of a difference of impurities to be doped and a difference of an amount thereof.

1. 7) Effect of Optical Element

Figure 15:
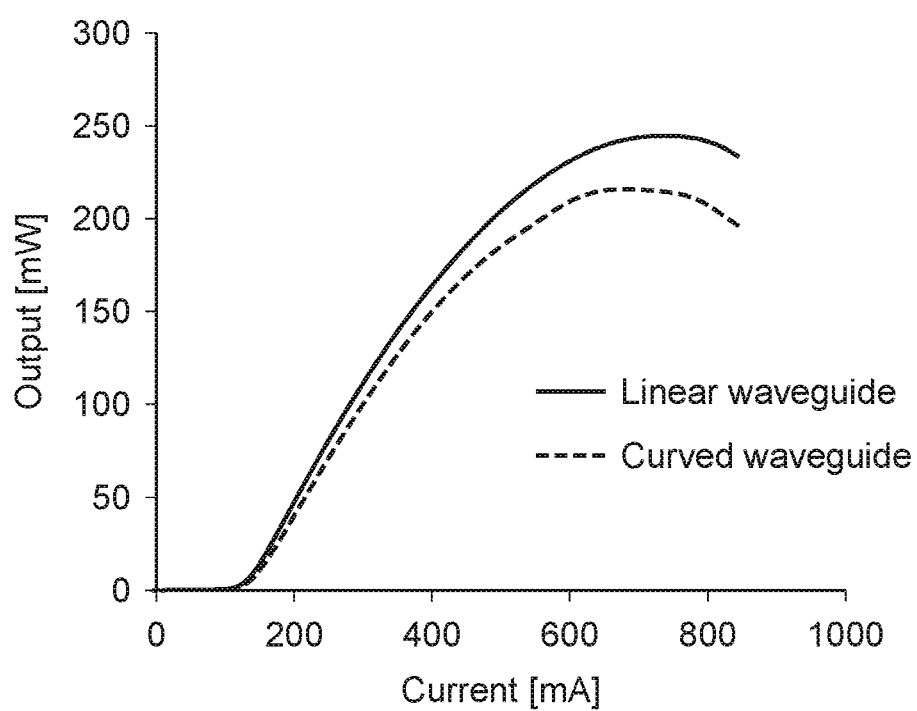
FIG. 15 A graph showing a difference of an optical output depending on shapes of a first waveguide of the optical element.

FIG. 15 is a graph showing output characteristics of a light emission element having a curved waveguide and a light emission element having a linear waveguide. In the linear waveguide, a loss generated in the curved waveguide is reduced, so the output is improved by approximately 11%.

By providing the first waveguide 32 in a linear form as described above, a waveguide loss caused by the waveguide form is not generated, and an amount of light emitted from the optical element 100 can be increased. Further, even in the case where the first waveguide 32 is a curved shape, a curvature can be reduced, so a waveguide loss caused by the waveguide form can be reduced.

Further, by reducing a size of a beam emitted from optical element 100 by the second waveguide 42, it is possible to achieve a high output of light and a beam spot having a small radius at the same time.

2. Optical Element According to Other Embodiments

In the following, other embodiments of the optical element 100 will be described. In the following description, the same elements as those of the optical element 100 according to the above embodiment are denoted by the same reference numerals or symbols, and a description thereof will be simplified or omitted. Different points will be mainly described.

2. 1) Different Embodiment 1

Figure 16:
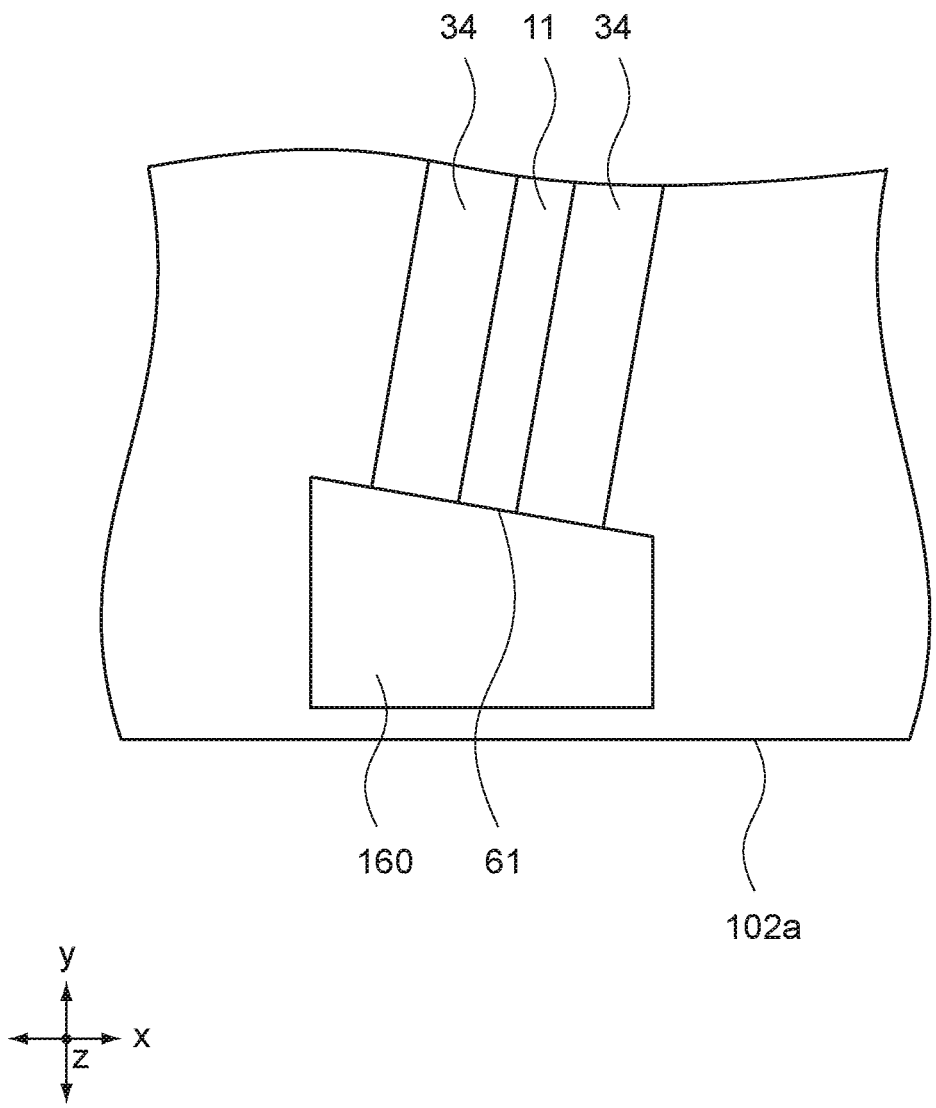
FIG. 16 A plan view showing a part of an optical element according to a different embodiment 1 in an enlarged manner.

FIG. 16 is a plan view showing an excavation structure 160 formed in the optical element 100 according to a different embodiment 1. The excavation structure 160 is an excavation structure formed from the first semiconductor layer 13 to the second semiconductor layer 17 as in the above embodiment, but is separated from the rear end surface 102a as shown in the figure.

As described above, by processing the wafer by using a cleavage, the optical element 100 is formed into a chip shape in a unit of the optical element. In the case where the excavation structure is connected to the rear end surface 102a, on the wafer, the excavation structure reaches the light emission end surface 101a of an adjacent chip. For this reason, it is necessary to form a dummy area between chips.

In contrast, as in this embodiment, by separating the excavation structure 160 from the rear end surface 102a, it is possible to prevent the excavation structure from reaching the light emission end surface 101a of the adjacent chip, and it is unnecessary to form the dummy area. As a result, it is possible to improve a yield and reduce a cost.

2. 2) Different Embodiment 2

Figure 17:
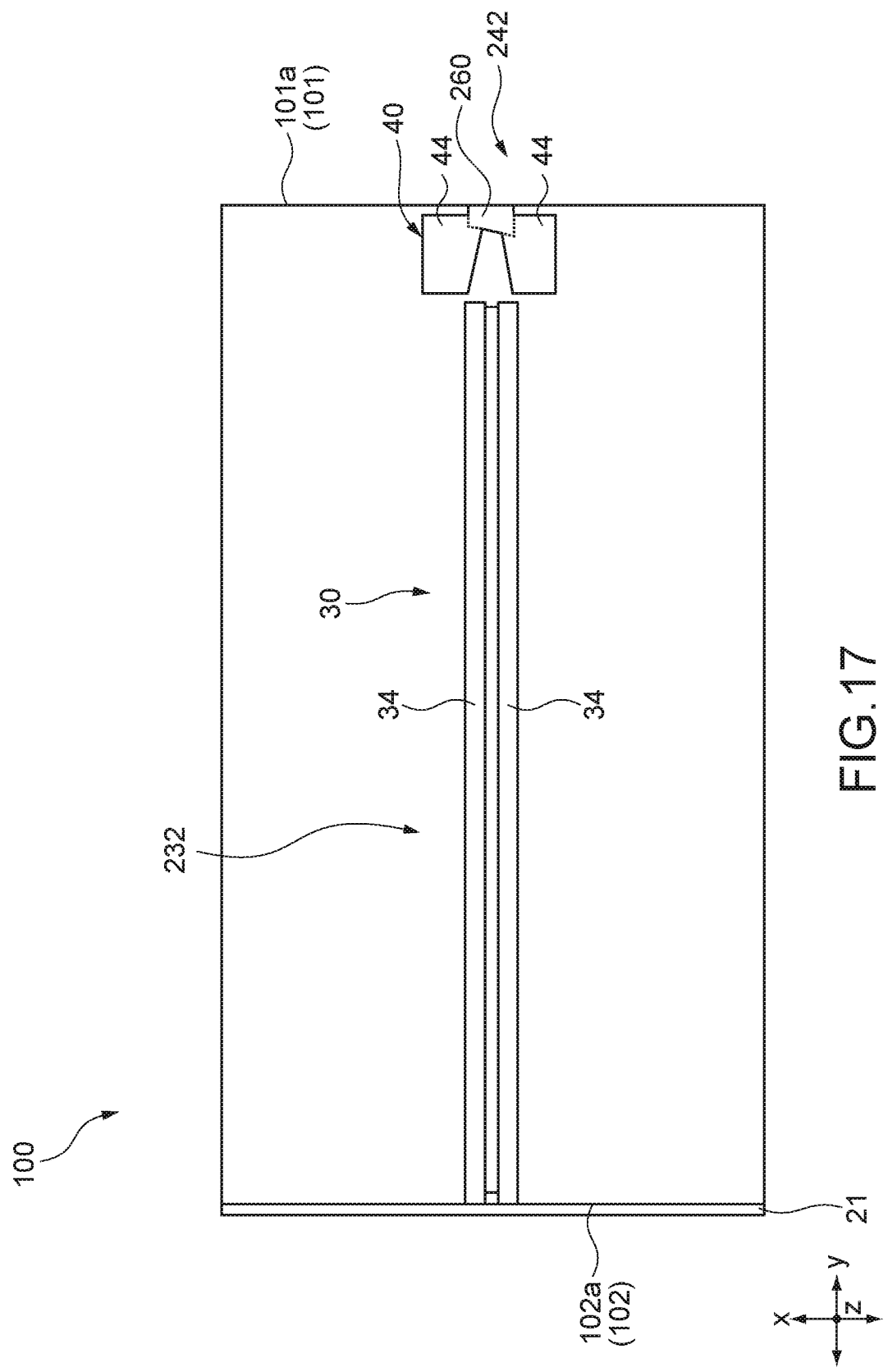
FIG. 17 A plan view showing an optical element according to a different embodiment 2.
Figure 18:
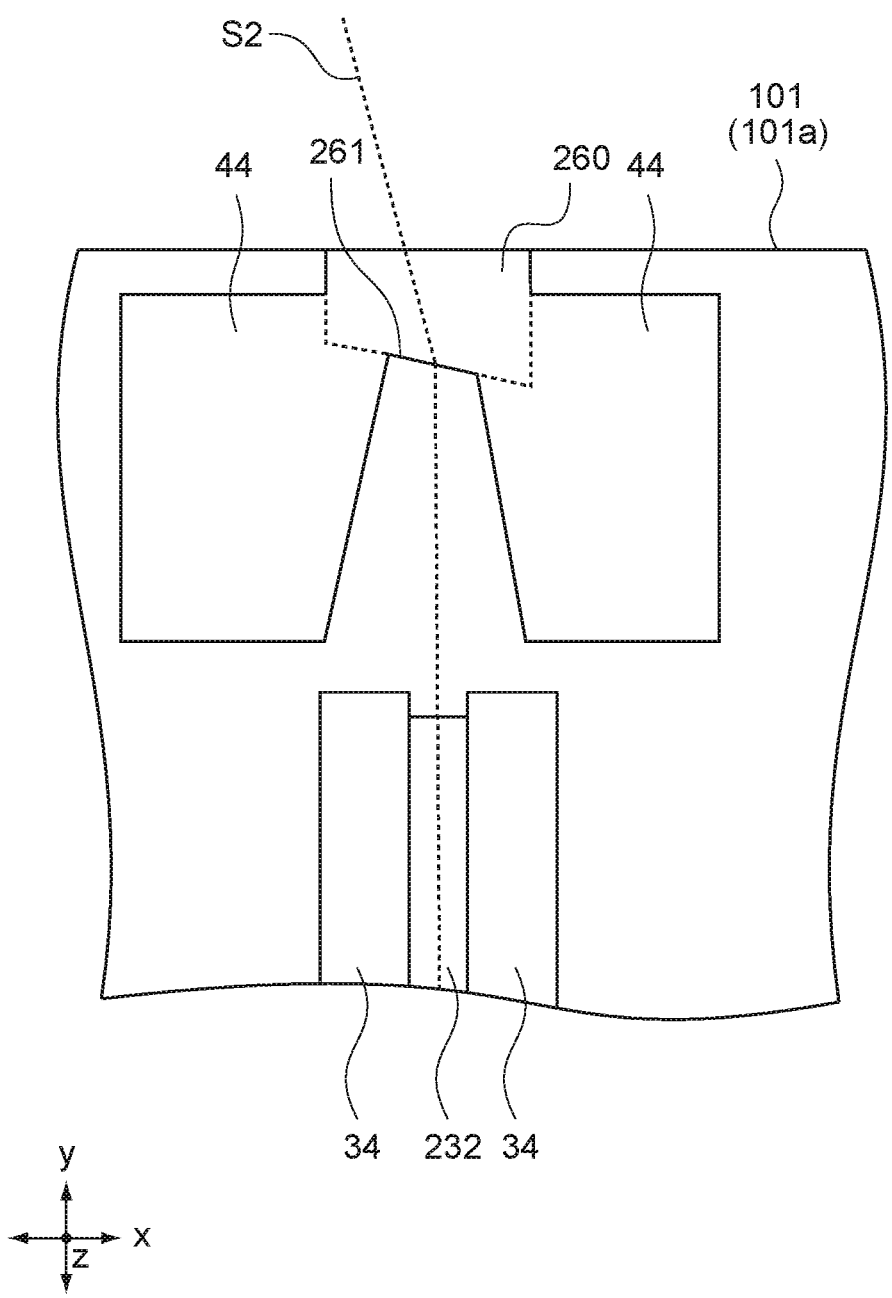
FIG. 18 A plan view showing a part of the optical element according to the different embodiment 2 in an enlarged manner.

FIG. 17 is a plan view of the optical element 100 according to the different embodiment 2, and FIG. 18 is an enlarged view thereof. As shown in those figures, the optical element 100 according to the different embodiment 2 includes a first waveguide 232, a second waveguide 242, and an excavation structure 260. When viewed in the z direction, the first waveguide 232 and the second waveguide 242 each have similar configurations to those in the above embodiment. Further, to the rear end surface 102a, the dielectric film 21 to prevent a reflection is provided.

The first waveguide 232 is extended linearly along a direction parallel to the longitudinal direction (y direction) of the optical element 100. The second waveguide 242 causes light emitted from the first waveguide 232 to be focused and be incident on a reflection surface to be described later.

The excavation structure 260 is provided to be adjacent to the second waveguide 242 on the light emission end 101, and is provided with a reflection surface 261. The reflection surface 261 is a surface tilted with respect to the light emission end surface 101a. The angle of the reflection surface 261 with respect to the light emission end surface 101a is not particularly limited, is preferably 3 degrees to 15 degrees inclusive, and is typically 5 degrees. On the reflection surface 261, an antireflection layer for reducing a light reflectance may be formed.

The reflection surface 261 reflects light incident from the second waveguide 242. In FIG. 18, an optical axis S2 of light that is incident from the first waveguide 232 and emitted from the second waveguide 242. Because the reflection surface 261 is tilted with respect to the light emission end surface 101a, as shown in the figure, the optical axis S2 of light incident from the second waveguide 242 is tilted by the reflection surface 261.

As a result, even if the linear first waveguide 232 is provided along a direction (x direction) parallel to the longitudinal direction of the optical element 100, emitted light of the optical element 100 is emitted to a direction tilted with respect to the light emission end surface 101a, and a laser oscillation is suppressed.

Figure 19:
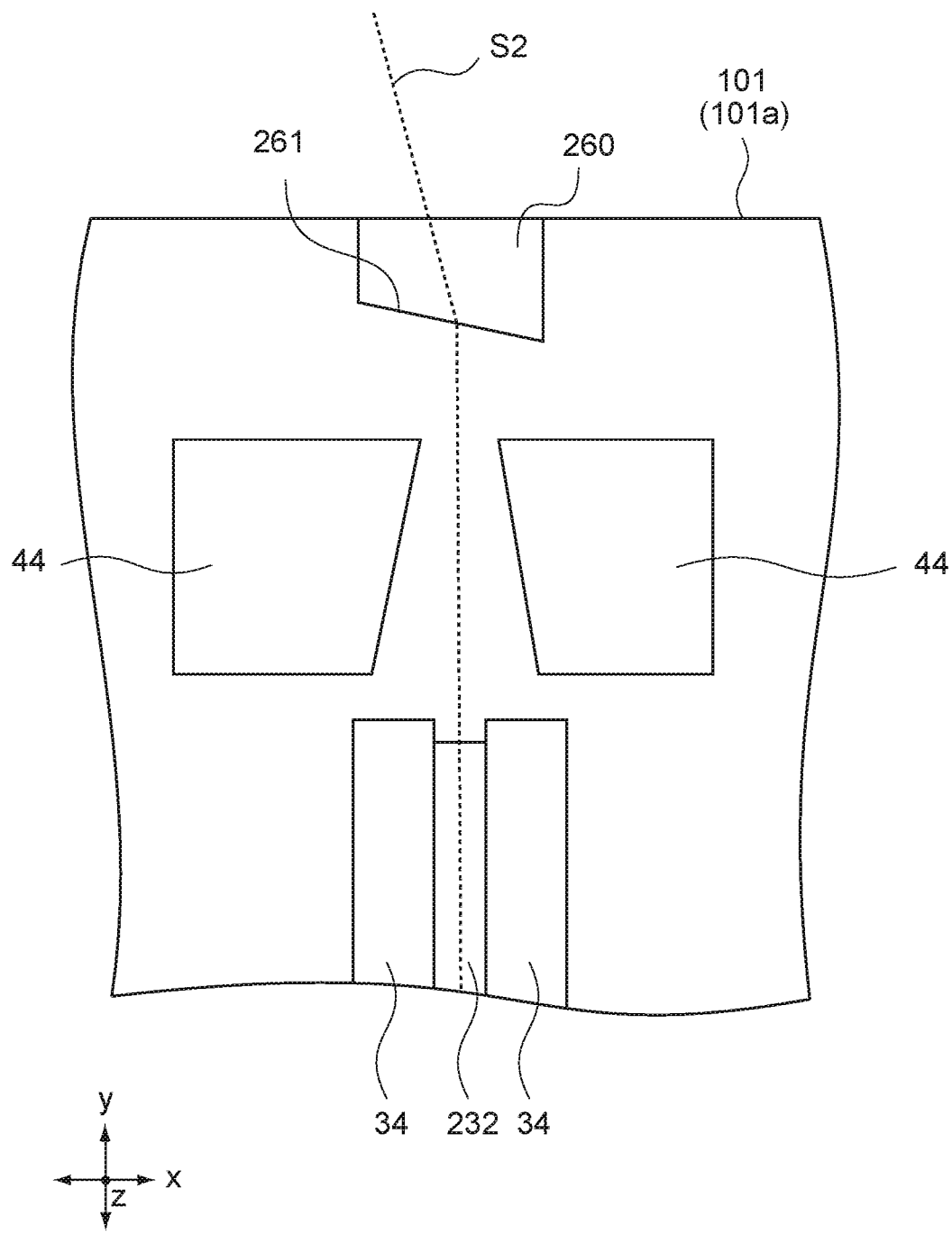
FIG. 19 A plan view showing a part of the optical element according to the different embodiment 2 in an enlarged manner.

It should be noted that the excavation structure 260 does not have to be provided continuously with the second depressed portion 44 as shown in FIG. 18, but may be provided so as to be separated from the second depressed portion 44 as shown in FIG. 19.

2. 3) Different Embodiment 3

Figure 20:
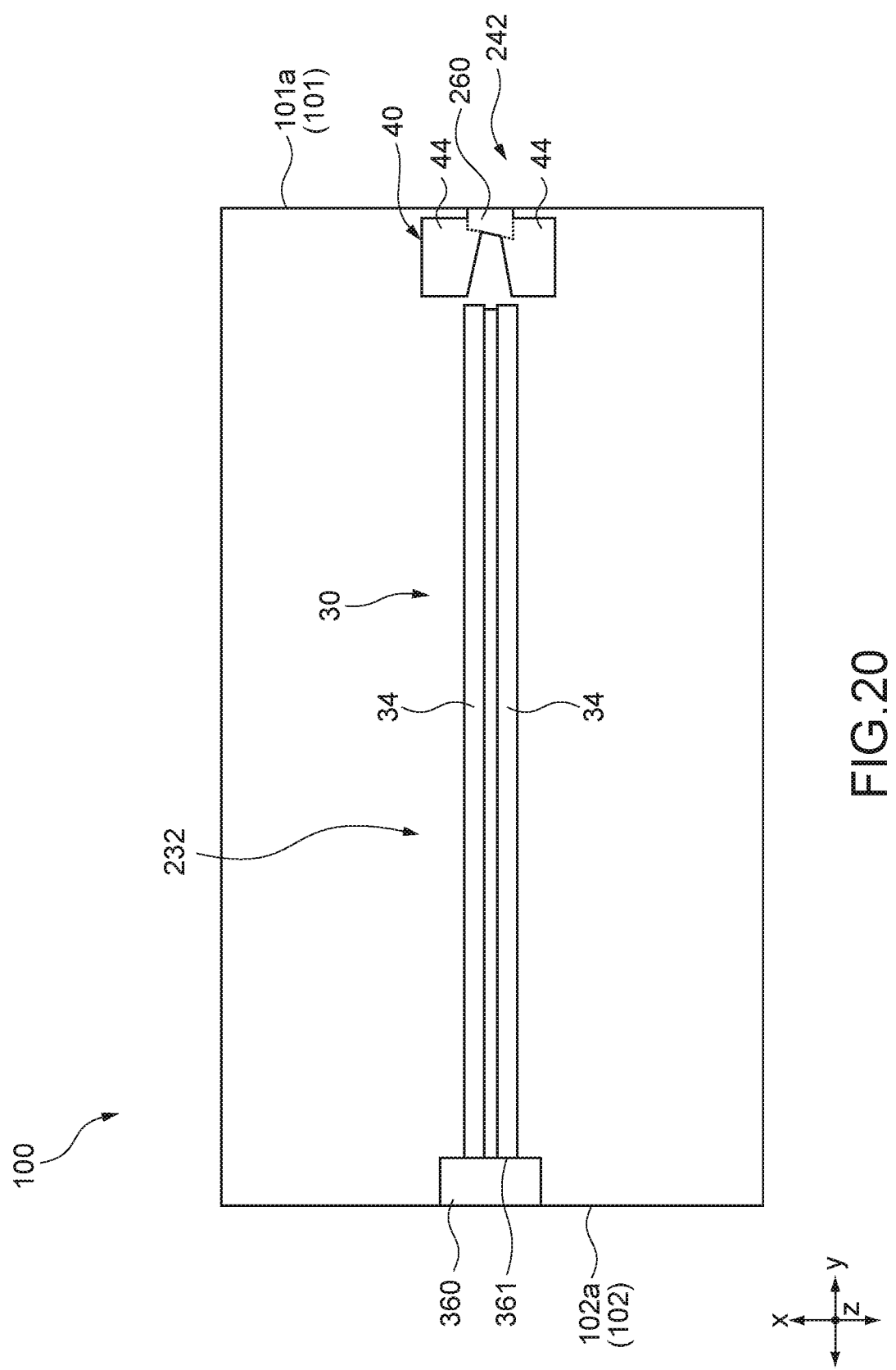
FIG. 20 A plan view showing an optical element according to a different embodiment 3.

FIG. 20 is a plan view showing the optical element 100 according to a different embodiment 3. As shown in the figure, the optical element 100 according to the different embodiment 3 is provided with an excavation structure 360 provided on the rear end surface 102a in addition to the configuration of the optical element 100 according to the different embodiment 2.

The excavation structure 360 is provided so as to be adjacent to the first waveguide 232 and is provided with a reflection surface 361.

The reflection surface 361 is a surface perpendicular to an extension direction (y direction) of the first waveguide 232, and is covered with a dielectric layer and a metal layer as in the above embodiment (see FIG. 9). Light that is incident from the first waveguide 232 on the reflection surface 361 is reflected by the reflection surface 361 toward the first waveguide 232.

By providing the excavation structure 360, there is no need to provide the rear end surface 102a dielectric film for preventing reflection, and thus it is possible to simplify a manufacture process and reduce a manufacture cost.

3. Display Apparatus

Figure 21:
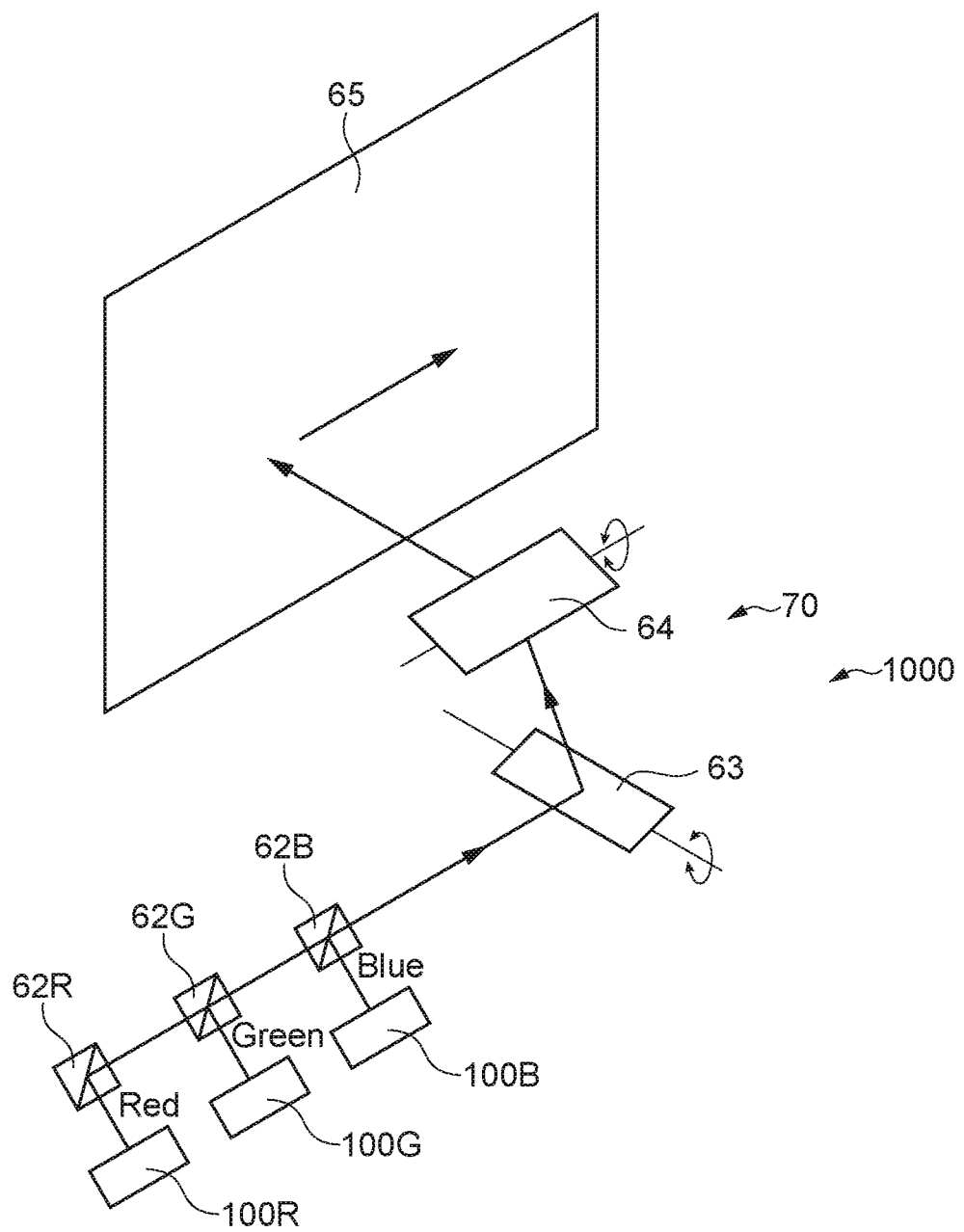
FIG. 21 A view schematically showing a configuration of a display apparatus which uses, as a light source, any of SLDs as a semiconductor light emission element according to each of the embodiments.

FIG. 21 schematically shows a configuration of a display apparatus that uses, as a light source, any one of the SLDs which are optical elements according to the respective embodiments. A display apparatus 1000 is a projector of a raster scan system.

The display apparatus 1000 is provided with an image generation unit 70. The image generation unit 70 is configured so as to be capable of two-dimensionally scanning light emitted from the optical element as the light source, for example, capable of performing raster scanning, and on the basis of image data, capable of controlling luminance by light projected on an irradiated surface 65 such as a screen, a wall surface, and the like.

The image generation unit 70 mainly includes, for example, a horizontal scanner 63 and a vertical scanner 64. An SLD 100R for red light emission, an SLD 100G for green light emission, and an SLD 100B for blue light emission are combined into one beam by dichroic prisms 62R, 62G, and 62B. The beam is scanner by the horizontal scanner 63 and the vertical scanner 64, and is projected on the irradiated surface 65, thereby displaying an image.

It should be noted that, out of the optical elements for RGB light emission, at least one only has to be an SLD, the other elements may be a normal LD.

The horizontal scanner 63 and the vertical scanner 64 are configured by a combination of a polygon mirror and a galvanometer scanner, for example. In this case, as a control means of the luminance, for example, a circuit that controls a current injected to the optical element is used.

Alternately, as a horizontal scanner and a vertical scanner, for example, a two-dimensional optical modulation element such as a DMD (Digital Micro-mirror Device) manufactured by using an MEMS (Micro Electro Mechanical System) technology may be used.

Alternately, the image generation unit 70 may be configured by a combination of a one-dimensional optical modulation element such as an GLV (Grating Light Valve) element and the one-dimensional scan mirror described above.

Alternately, the image generation unit 70 may be configured by a refractive index modulation type scanner such as an acousto-optical effect scanner and an electro-optical effect scanner.

5. Other Various Embodiments

The present technology is not limited to the embodiments described above, and other various embodiments can be achieved.

For example, in the embodiment described with reference to FIG. 1, the second depressed portion 44 in the second area 40 in the waveguide structure 50 is configured so as to be deeper than the active layer 15. However, for example, the depth of the second depressed portion 44 (depth position of the bottom surface 44a of the second depressed portion 44) does not have to reach the active layer 15. As the gist of the present technology, it is important that the second refractive index difference in the second area 40 is larger than the first refractive index difference in the first area 30. This is because the difference in the refractive index differences is one element for promoting a light confinement effect in the second area 40. The same holds true for the other embodiments.

Thus, for example, the first area 30 does not have to include the first depressed portion 34 provided on the first semiconductor layer 13. For example, the first area 30 according to the present technology may be configured in such a manner that, as disclosed in Japanese Patent Application Laid-open No. 2005-12044, a current blocking area (that is, non-current injection area) on the second semiconductor layer 17 is provided around the first waveguide 32. The same holds true for the other embodiments.

In the above embodiment, the first conductivity type is set to the p type, and the second conductivity type is set to the n type. However, the first conductivity type may be set to the n type, and the second conductivity type may be set to the p type.

At least two of the feature parts of the embodiments described above can be combined.

It should be noted that the present technology can take the following configurations.

(1)

An optical element including a substrate, a first end which is a light emission end, and a second end provided on an opposite side to the first end, the optical element including:

a first electrode layer having a stripe form, the first electrode layer being extended from the second end toward the first end;

a first semiconductor layer that has a first conductivity type and includes a current injection area formed by the first electrode layer and a non-current injection area;

a second semiconductor layer that has a second conductivity type and is provided on the substrate;

an active layer that is provided between the first semiconductor layer and the second semiconductor layer; and a second electrode layer that is in contact with the substrate or the second semiconductor layer, in which a waveguide structure included in the first conductivity type layer, the active layer, and the second conductivity type layer includes a first area having a first waveguide configured by the current injection area and the non-current injection area, and having a first refractive index difference as a difference between a refractive index of the current injection area and a refractive index of the non-current injection area, and a second area provided between the first area and the first end, the second area having a second waveguide provided to be extended from the first waveguide toward the first end, and having a second refractive index difference larger than the first refractive index difference as a difference between a refractive index of the second waveguide and a refractive index of an area around the second waveguide in the second area, and the second waveguide has a tapered structure that makes a beam spot of light incident from the first waveguide smaller, the optical element including a reflection surface that is formed by an excavation structure provided from the first semiconductor layer to the active layer on at least one of the first end and the second end, and reflects light incident from the first waveguide or the second waveguide.

(2)

The optical element according to (1) described above, in which an optical axis of light emitted from the optical element is non-perpendicular to an end surface of the first end.

(3)

The optical element according to (1) or (2) described above, in which the first waveguide has a linear form.

(4)

The optical element according to any one of (1) to (3) described above, in which the first waveguide is extended along a direction that is non-perpendicular to an end surface of the first end, the excavation structure is provided on the second end, and the reflection surface reflects light incident from the first waveguide toward the first waveguide.

(5)

The optical element according to (4) described above, in which the end surface of the first end and an end surface of the second end are parallel to each other, and the reflection surface is configured to be perpendicular to an optical axis of light emitted from the first waveguide, and to be non-parallel to the end surface of the second end.

(6)

The optical element according to any one of (1) to (5) described above, in which the first waveguide is extended along a direction perpendicular to an end surface of the first end, the excavation structure is provided on the first end, and the reflection surface tilts the light incident from the second waveguide in such a manner that an optical axis is non-perpendicular to the end surface of the first end.

(7)

The optical element according to (6) described above, in which the reflection surface is non-perpendicular to an optical axis of light emitted from the second waveguide, and is non-parallel to the end surface of the first end.

(8)

The optical element according to any one of (1) to (7) described above, in which the optical axis of light emitted from the optical element is tilted with respect to a perpendicular of the end surface of the first end by 3 degrees or more.

(9)

The optical element according to any one of (1) to (8) described above, in which the reflection surface is covered with a dielectric film.

(10)

The optical element according to any one of (1) to (9) described above, in which the reflection surface is covered with a metal film.

(11)

The optical element according to any one of (1) to (12) described above, the optical element being a super luminescent diode.

(12)

A display apparatus, including:

an optical element including a substrate, a first end which is a light emission end, and a second end provided on an opposite side to the first end; and an image generation unit capable of two-dimensionally scanning light emitted from the optical element, and controlling luminance caused by the light to be projected on a basis of image data, in which the optical element includes a first electrode layer having a stripe form, the first electrode layer being extended from the second end toward the first end, a first semiconductor layer that has a first conductivity type and includes a current injection area formed by the first electrode layer and a non-current injection area, a second semiconductor layer that has a second conductivity type and is provided on the substrate, an active layer that is provided between the first semiconductor layer and the second semiconductor layer, and a second electrode layer that is in contact with the substrate or the second semiconductor layer, a waveguide structure included in the first conductivity type layer, the active layer, and the second conductivity type layer includes a first area having a first waveguide configured by the current injection area and the non-current injection area, and having a first refractive index difference as a difference between a refractive index of the current injection area and a refractive index of the non-current injection area, and a second area provided between the first area and the first end, the second area having a second waveguide provided to be extended from the first waveguide toward the first end, and having a second refractive index difference larger than the first refractive index difference as a difference between a refractive index of the second waveguide and a refractive index of an area around the second waveguide in the second area, and the second waveguide has a tapered structure that makes a beam spot of light incident from the first waveguide smaller, the optical element including a reflection surface that is formed by an excavation structure provided from the first semiconductor layer to the active layer on at least one of the first end and the second end, and reflects light incident from the first waveguide or the second waveguide.

REFERENCE SIGNS LIST

11 . . . first electrode layer
12 . . . second electrode layer
13 . . . first semiconductor layer
15 . . . active layer
17 . . . second semiconductor layer
19 . . . substrate
30 . . . first area
32, 232 . . . first waveguide
34 . . . first depressed portion
40 . . . second area
42, 242 . . . second waveguide
44 . . . second depressed portion
50 . . . waveguide structure
60, 160, 260, 360 . . . excavation structure
61, 261, 361 . . . reflection surface
70 . . . image generation unit
100 . . . optical element
101 . . . light emission end
101a . . . light emission end surface
102 . . . rear end
102a . . . rear end surface
1000 . . . display apparatus

The invention claimed is:

1. An optical element including a substrate, a first end which is a light emission end, and a second end on an opposite side to the first end, the optical element comprising:

a first electrode layer having a stripe form, the first electrode layer being extended from the second end toward the first end;

a first semiconductor layer that is a first conductivity type layer and includes a current injection area formed by the first electrode layer and a non-current injection area;

a second semiconductor layer that is a second conductivity type layer and is on the substrate;

an active layer that is between the first semiconductor layer and the second semiconductor layer; and a second electrode layer that is in contact with the substrate or the second semiconductor layer, wherein a waveguide structure included in the first conductivity type layer, the active layer, and the second conductivity type layer includes a first area having a first waveguide configured by the current injection area and the non-current injection area, and having a first refractive index difference as a difference between a refractive index of the current injection area and a refractive index of the non-current injection area, and a second area between the first area and the first end, the second area having a second waveguide to be extended from the first waveguide toward the first end, and having a second refractive index difference larger than the first refractive index difference as a difference between a refractive index of the second waveguide and a refractive index of an area around the second waveguide in the second area, and the second waveguide has a tapered structure that makes a beam spot of light incident from the first waveguide smaller, the optical element including a reflection surface that is formed by an excavation structure that is from the first semiconductor layer to the active layer on at least one of the first end and the second end, and reflects light incident from the first waveguide or the second waveguide.

2. The optical element according to claim 1, wherein an optical axis of light emitted from the optical element is non-perpendicular to an end surface of the first end.

3. The optical element according to claim 1, wherein the first waveguide has a linear form.

4. The optical element according to claim 1, wherein the first waveguide is extended along a direction that is non-perpendicular to an end surface of the first end, the excavation structure is on the second end, and the reflection surface reflects light incident from the first waveguide toward the first waveguide.

5. The optical element according to claim 4, wherein the end surface of the first end and an end surface of the second end are parallel to each other, and the reflection surface is configured to be perpendicular to an optical axis of light emitted from the first waveguide, and to be non-parallel to the end surface of the second end.

6. The optical element according to claim 1, wherein the first waveguide is extended along a direction perpendicular to an end surface of the first end, the excavation structure is on the first end, and the reflection surface tilts the light incident from the second waveguide in such a manner that an optical axis is non-perpendicular to the end surface of the first end.

7. The optical element according to claim 6, wherein the reflection surface is non-perpendicular to an optical axis of light emitted from the second waveguide, and is non-parallel to the end surface of the first end.

8. The optical element according to claim 2, wherein the optical axis of light emitted from the optical element is tilted with respect to a perpendicular of the end surface of the first end by 3 degrees or more.

9. The optical element according to claim 1, wherein the reflection surface is covered with a dielectric film.

10. The optical element according to claim 1, wherein the reflection surface is covered with a metal film.

11. The optical element according to claim 1, the optical element being a super luminescent diode.

12. A display apparatus, comprising:

an optical element including a substrate, a first end which is a light emission end, and a second end on an opposite side to the first end; and an image generation unit capable of two-dimensionally scanning light emitted from the optical element, and controlling luminance caused by the light to be projected on a basis of image data, wherein the optical element includes
 a first electrode layer having a stripe form, the first electrode layer being extended from the second end toward the first end,
 a first semiconductor layer that is a first conductivity type layer and includes a current injection area formed by the first electrode layer and a non-current injection area,
 a second semiconductor layer that is a second conductivity type layer and is on the substrate,
 an active layer that is between the first semiconductor layer and the second semiconductor layer, and
 a second electrode layer that is in contact with the substrate or the second semiconductor layer, a waveguide structure included in the first conductivity type layer, the active layer, and the second conductivity type layer includes
 a first area having a first waveguide configured by the current injection area and the non-current injection area, and having a first refractive index difference as a difference between a refractive index of the current injection area and a refractive index of the non-current injection area, and
 a second area between the first area and the first end, the second area having a second waveguide to be extended from the first waveguide toward the first end, and having a second refractive index difference larger than the first refractive index difference as a difference between a refractive index of the second waveguide and a refractive index of an area around the second waveguide in the second area, and the second waveguide has a tapered structure that makes a beam spot of light incident from the first waveguide smaller, the optical element including a reflection surface that is formed by an excavation structure that is from the first semiconductor layer to the active layer on at least one of the first end and the second end, and reflects light incident from the first waveguide or the second waveguide.

* * * * *